(12) United States Patent
Park et al.

(10) Patent No.: US 11,422,955 B2
(45) Date of Patent: Aug. 23, 2022

(54) ELECTRONIC DEVICE

(71) Applicant: HEWLETT-PACKARD DEVELOPMENT COMPANY, L.P., Spring, TX (US)

(72) Inventors: Seung-hun Park, Suwon-si (KR); Seob Cho, Suwon-si (KR); Keon-young Seo, Suwon-si (KR); Nam-jin Kim, Suwon-si (KR); Kwang-Rae Jo, Suwon-si (KR); Jung-Soo Park, Suwon-si (KR); Youn-Jae Kim, Suwon-si (KR); Jeong-Nam Cheon, Suwon-si (KR)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 827 days.

(21) Appl. No.: 16/315,058

(22) PCT Filed: Jun. 16, 2017

(86) PCT No.: PCT/KR2017/006287
§ 371 (c)(1),
(2) Date: Jan. 3, 2019

(87) PCT Pub. No.: WO2018/008870
PCT Pub. Date: Jan. 11, 2018

(65) Prior Publication Data
US 2020/0183863 A1 Jun. 11, 2020

(30) Foreign Application Priority Data

Jul. 4, 2016 (KR) .................. 10-2016-0084292

(51) Int. Cl.
*H05K 1/18* (2006.01)
*G06F 13/16* (2006.01)
(Continued)

(52) U.S. Cl.
CPC ........ *G06F 13/1668* (2013.01); *G06F 3/0604* (2013.01); *G06F 3/0659* (2013.01);
(Continued)

(58) Field of Classification Search
CPC .. G06F 13/1668; G06F 3/0604; G06F 3/0659; G06F 3/0673; G06F 11/0727;
(Continued)

(56) References Cited

U.S. PATENT DOCUMENTS 6,175,280 B1 * 1/2001 Lloyd .................. H03J 1/0008
331/1 R
6,269,443 B1 7/2001 Poisner et al.
(Continued)

FOREIGN PATENT DOCUMENTS

CN 1314625 9/2001
CN 101582266 11/2009
(Continued)

*Primary Examiner* — Albert Decady
*Assistant Examiner* — Enam Ahmed
(74) *Attorney, Agent, or Firm* — Staas & Halsey LLP

(57) ABSTRACT

An electronic device is disclosed. The electronic device comprises a circuit board, a memory part comprising a plurality of first memory chips mounted on the circuit board, a socket part comprising a plurality of terminals electrically connected to a memory module which comprises a plurality of second memory chips, a memory controller for controlling the operation of the plurality of first memory chips and, when the memory module is connected to the socket part, controlling the operation of the plurality of first memory chips and the plurality of second memory chips, a conductive pattern comprising a control line which sequentially connects, from the memory controller, one or more of the plurality of terminals on the socket part and the plurality of first memory chips, and a capacitive element connected to
(Continued)

the control line at a preset position between the one or more terminals on the socket part and the memory controller.

14 Claims, 28 Drawing Sheets

(51) Int. Cl.
*G06F 3/06* (2006.01)
*G06F 11/07* (2006.01)

(52) U.S. Cl.
CPC ........ *G06F 3/0673* (2013.01); *G06F 11/0727* (2013.01); *G06F 11/0751* (2013.01); *G06F 11/0793* (2013.01); *H05K 1/181* (2013.01); *H05K 2201/10159* (2013.01)

(58) Field of Classification Search
CPC ............. G06F 11/0751; G06F 11/0793; G06F 13/4068; G06F 13/4086; G06F 13/16; H05K 1/181; H05K 2201/10159
USPC ............................................................ 714/2
See application file for complete search history.

(56) References Cited

U.S. PATENT DOCUMENTS

| | | | | |
|---|---|---|---|---|
| 6,295,591 B1 * | 9/2001 | Bealkowski | ........... | G11C 29/74 711/115 |
| 6,357,018 B1 * | 3/2002 | Stuewe | ............... | G06F 11/2284 714/37 |
| 6,745,268 B1 | 6/2004 | Greeff et al. | | |
| 7,292,950 B1 * | 11/2007 | Resnick | .............. | G06F 11/1044 700/1 |
| 8,812,933 B2 * | 8/2014 | Joo | ...................... | H03M 13/151 714/766 |
| 2001/0018752 A1 | 8/2001 | Yoshioka | | |
| 2001/0044875 A1 * | 11/2001 | Mailloux | .............. | G11C 7/1027 711/105 |
| 2002/0000797 A1 * | 1/2002 | Schultz | ............... | H02M 3/1582 323/282 |
| 2004/0170074 A1 | 9/2004 | Greeff et al. | | |
| 2008/0082751 A1 * | 4/2008 | Okin | ................... | G06F 12/0246 711/E12.001 |
| 2010/0026408 A1 * | 2/2010 | Shau | ....................... | H05K 1/181 333/1 |
| 2011/0219274 A1 * | 9/2011 | Cho | ........................ | G06F 11/00 714/708 |
| 2012/0191921 A1 * | 7/2012 | Shaeffer | ................ | G06F 1/3275 710/316 |
| 2015/0149810 A1 * | 5/2015 | Packer Ali | .......... | G06F 11/1441 714/2 |
| 2020/0381406 A1 * | 12/2020 | Dominguez | ........ | H01L 23/3128 |

FOREIGN PATENT DOCUMENTS

| | | |
|---|---|---|
| JP | 2001184297 | 7/2001 |
| JP | 2001265708 | 9/2001 |
| JP | 2006318242 | 11/2006 |
| KR | 20020092679 | 12/2002 |
| KR | 1020020094366 | 12/2002 |

* cited by examiner

FIG. 13

| OPERATING FREQUENCY | Clock SIGNAL | 666.666MHz | 800MHz | 933.333MHz | 1066.666MHz | 1333.333MHz | 16000MHz |
|---|---|---|---|---|---|---|---|
| | Command SIGNAL | 333.333MHz | 400MHz | 466.666MHz | 533.333MHz | 666.666MHz | 800MHz |
| OPERATING FREQUENCY OF ODD MULTIPLICATION OF COMMAND SIGNAL FROM MEMORY SOCKET TO CONTROLLER λ/4 POSITION | 1MULTIPLICATION | 225.00mm | 187.50mm | 160.71mm | 140.63mm | 112.50mm | 93.75mm |
| | 3MULTIPLICATION | 75.00mm | 62.50mm | 53.57mm | 46.88mm | 37.50mm | 31.25mm |
| | 5MULTIPLICATION | 45.00mm | 37.50mm | 32.14mm | 28.13mm | 22.50mm | 18.75mm |
| | 7MULTIPLICATION | 32.14mm | 26.79mm | 22.96mm | 20.09mm | 16.07mm | 13.39mm |
| | 9MULTIPLICATION | 25.00mm | 20.83mm | 17.86mm | 15.63mm | 12.50mm | 10.42mm |
| | 11MULTIPLICATION | 20.45mm | 17.05mm | 14.61mm | 12.78mm | 10.23mm | 8.52mm |
| | 13MULTIPLICATION | 17.31mm | 14.42mm | 12.36mm | 10.82mm | 8.65mm | 7.21mm |
| | 15MULTIPLICATION | 15.00mm | 12.50mm | 10.71mm | 9.38mm | 7.50mm | 6.25mm |
| | 17MULTIPLICATION | 13.24mm | 11.03mm | 9.45mm | 8.27mm | 6.62mm | 5.51mm |
| | 19MULTIPLICATION | 11.84mm | 9.87mm | 8.46mm | 7.40mm | 5.92mm | 4.93mm |
| | 21MULTIPLICATION | 10.71mm | 8.93mm | 7.65mm | 6.70mm | 5.36mm | 4.46mm |

ELECTRONIC DEVICE

CROSS REFERENCE TO RELATED APPLICATIONS

This application is being filed under 35 U.S.C. § 371 as a PCT national stage of PCT International Application No. PCT/KR 2017/006287 filed on Jun. 16, 2017, which claims the priority benefit of Korean Patent Application No. 10-2016-0084292 filed on Jul. 4, 2016. Both the International Application and the Korean Patent Application are incorporated by reference herein in their entirety.

BACKGROUND ART

An electronic device includes a memory element (e.g., a volatile memory element) for driving an operating system. Such a memory element is generally mounted on a circuit board by direct soldering or mounted on the circuit board through a socket.

Meanwhile, in order to improve a performance of the electronic device, it has been necessary to increase a capacity of an installed memory element as needed. In a case in which the memory element was soldered directly to the circuit board, the memory element soldered to the circuit board would need to be detached from the circuit board and a larger capacity memory element would have to be mounted on the circuit board by soldering.

However, such a method has a disadvantage in that a large amount of heat should be applied to the circuit board when an existing memory element is detached from the circuit board and a new memory element is mounted on the circuit board, which may impact the circuit board, and significant replacement cost and time are consumed. Further, such a method has a disadvantage in that it does not utilize the existing memory element.

In addition, in a case in which the memory element is mounted on the circuit board through a socket, there is an advantage in that a capacity of the memory element may be increased in a very short time because the existing memory element is detached from the socket and a new memory element is simply connected to the socket. However, such a case also has a disadvantage in that the existing memory element is not utilized.

Therefore, a method capable of easily expanding a memory capacity while utilizing the existing memory element is required.

DISCLOSURE

Description of Drawings

FIG. 13 is a table illustrating distance examples of the capacitive element for each of the operating frequencies and odd multiplications.

DETAILED DESCRIPTION

Hereinafter, diverse examples will be described with reference to the accompanying drawings. The examples described below may be modified and implemented in various different forms. In order to more clearly describe the features of the examples, a detailed description of known matters to those skilled in the art will be omitted.

Meanwhile, as used herein, when any one component is referred to as being "connected to" another component, it means that any one component and another component are directly connected to each other or are connected to each other while having the other component interposed therebetween. Unless explicitly described to the contrary, "including" any component will be understood to imply the inclusion of other components rather than the exclusion of other components.

As used herein, the term "image forming job" may refer to various jobs related to an image (e.g., printing, copying, scanning, or faxing), such as forming an image or creating/storing/transmitting of an image file, and the term "job" may refer not only to the image forming job, but also to a series of processes necessary for performing the image forming job.

In addition, the term "image forming device" refers to an apparatus that prints print data generated by a terminal device such as a computer on recording paper. Examples of such an image forming device may include a copying machine, a printer, a facsimile, a scanner or a multi-function printer (MFP) that complexly implements the functions of the copy machine, the printer, the facsimile and the scanner through a single device. The image forming device may refer to all apparatuses capable of performing the image forming job, such as the printer, the scanner, a fax machine, the multi-function printer (MFP), or a display device.

In addition, the term "hard copy" may refer to an operation of outputting an image onto a print medium, such as paper, and the term "soft copy" may refer to an operation of outputting an image onto a display device, such as a TV or a monitor.

In addition, the term "contents" may refer to all kinds of data that are subject to the image forming job, such as photographs, images, or document files.

In addition, the term "print data" may refer to data converted into a printable format in the printer. Meanwhile, in a case in which the printer supports directing printing, the file itself may be print data.

In addition, the term "user" may refer to a person who performs an operation related to the image forming job by using the image forming device or by using a device connected with the image forming device in a wired or wireless manner. In addition, the term "administrator" may refer to a person who has authority to access all the functions and systems of the image forming device. "Administrator" and "user" may be the same person.

Figure 1:
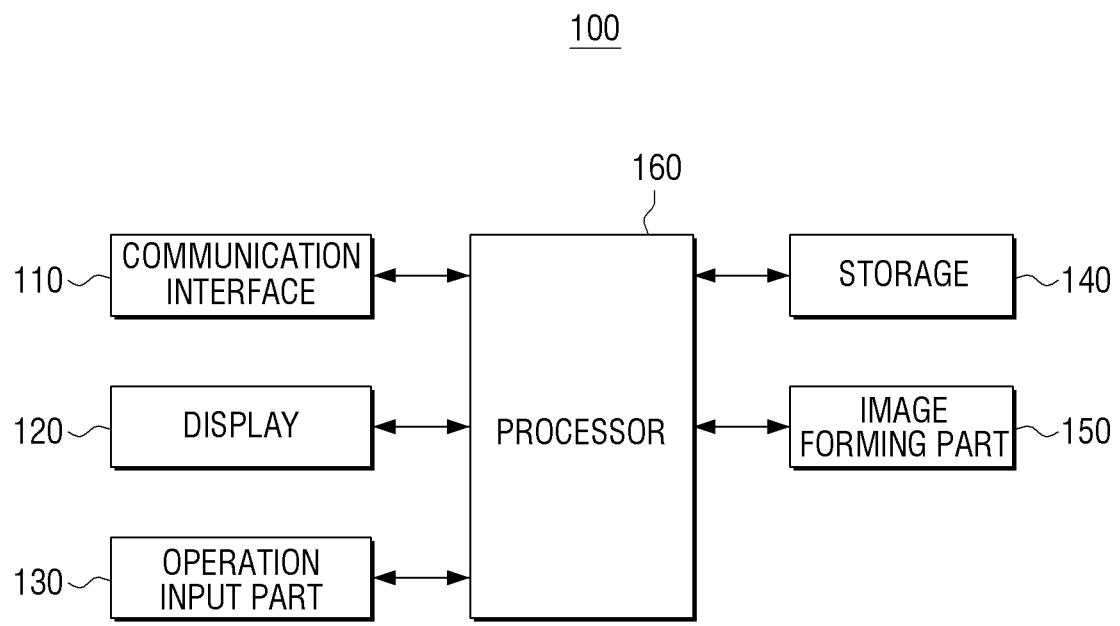
FIG. 1 is a block diagram of a case in which an electronic device according to an example is an image forming device.

FIG. 1 is a block diagram of a case in which an electronic device according to an example is an image forming device.

Referring to FIG. 1, an electronic device 100 includes a communication interface 110, a display 120, an operation input part 130, a storage 140, an image forming part 150, and a processor 160. Here, the electronic device 100 may be a PC capable of expanding a volatile memory, a notebook, a tablet PC, an image forming device, or the like.

The communication interface 110 may be connected to a terminal device (not illustrated) of a mobile device (e.g., smart phone, tablet PC), a PC, a notebook PC, a PDA, a digital camera, or the like, and may receive files and print data from the terminal device (not illustrated). Specifically, the communication interface 110 is formed to connect the electronic device 100 with an external device, and may be implemented in the form connected to the terminal device through a universal serial bus (USB) port or a wireless communication (e.g., Wi-Fi 802.11a/b/g/n, NFC, Bluetooth) port, as well as the form connected to the terminal device through a local area network (LAN) and an Internet network.

The display 120 displays a variety of information provided by the electronic device 100. Specifically, the display 120 may display a user interface window for selecting various functions provided by the electronic device 100. The display 120 may be a monitor such as a liquid crystal display (LCD), a cathode ray tube (CRT), or an organic light emitting diode (OLED), and may also be implemented as a touch screen capable of simultaneously performing a function of the operation input part 130.

In addition, the display 120 may display a control menu for performing a function of the electronic device 100. In addition, in a case in which an error occurs in the electronic device 100 or an operating frequency of a memory module installed in a socket part and an operating frequency of a memory part are different from each other, the display 120 may display notification information therefor. An example of the displayed notification information will be described below with reference to FIGS. 22 and 23.

The operation input part 130 may receive a function selection from a user and a control command for the function. Here, the function may include a print function, a copy function, a scan function, a fax transmission function, and the like. The operation input part 130 may receive the control command through the control menu displayed on the display 120.

The operation input part 130 may be implemented as a plurality of buttons, a keyboard, a mouse, or the like, and may also be implemented as a touch screen capable of simultaneously performing a function of the display 120 described above.

The operation input part 130 may receive a reset command. Specifically, in a case in which an error occurs during an access process of a memory element, the operation input part 130 may receive, from a user, a reset command for resetting a memory controller for changing an operating frequency of a control signal.

The storage 140 may store the print data received through the communication interface 110. The storage 140 may be implemented as a storage medium (e.g., a non-volatile memory such as a hard disk drive (HDD), a solid state drive (SSD), a flash memory) in the electronic device 100, and an external storage medium, for example, a removable disk including a USB memory, a storage medium connected to a host, a web server over a network, or the like.

The image forming part 150 may print the print data. The image forming part 150 may form an image on a recording medium by various printing methods, such as an electrophotographic method, an inkjet method, a thermal transfer method, and a sensible heat method. For example, the image forming part 150 may print the image on the recording medium by a series of processes including exposure, development, transfer, and fixation processes. A detailed configuration of the image forming part 150 will be described below with reference to FIG. 2.

The processor 160 controls the respective configurations in the electronic device 100. Specifically, the processor 160 may be implemented as a central processing unit (CPU), a memory, a read only memory (ROM), or the like, may perform a booting operation of loading an operating system stored in the storage 140 into the memory based on a program stored in the ROM, and may execute a variety of services provided by the electronic device 100 after the booting operation. A detailed configuration of the processor 160 will be described below with reference to FIG. 2.

In addition, when the processor 160 receives the print data from the outside, the processor 160 may perform an operation such as parsing to control the image forming part 150 so that a print for the received print data is performed.

In describing FIG. 1, although it is described that the electronic device 100 includes only the image forming part, the electronic device 100 may further include a scanner that performs a scan function, a facsimile transceiver that performs a facsimile transmission and reception function depending on functions supported by the electronic device 100. In addition, in a case in which the electronic device 100 is implemented as a general PC, a smart phone, a tablet, or the like, the configuration of the image forming part 150 described above may also be omitted.

Figure 2:
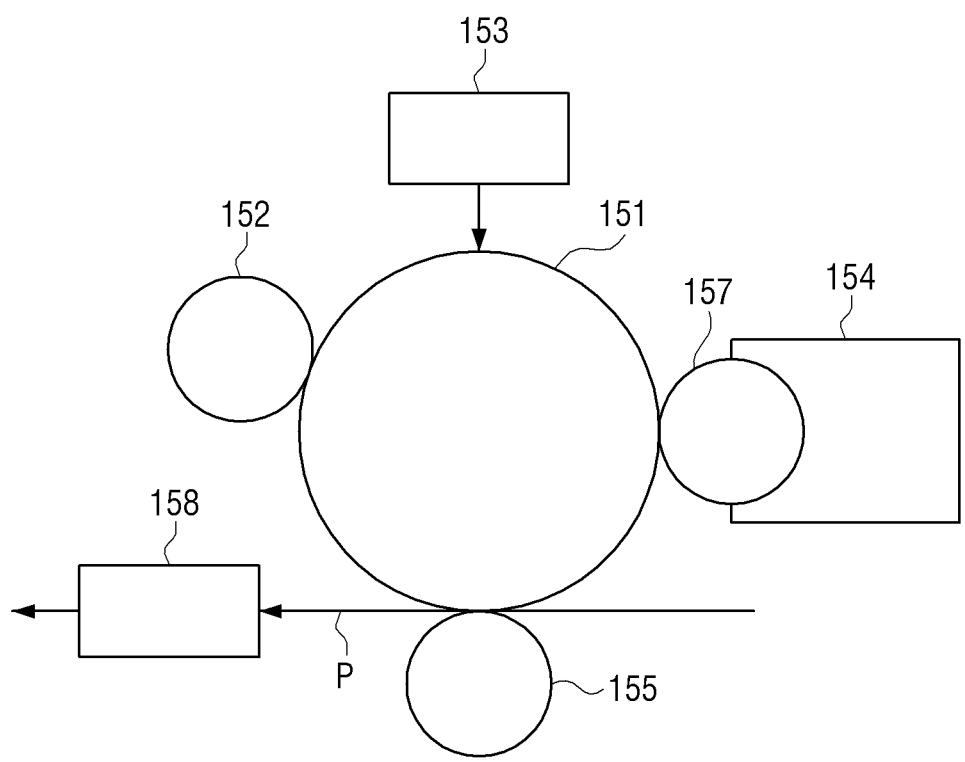
FIG. 2 is a block diagram according to an example of an image forming part of FIG. 1.

FIG. 2 is a block diagram according to an example of the image forming part of FIG. 1.

Referring to FIG. 2, the image forming part 150 includes a photoreceptor 151, a charger 152, an exposer 153, a developer 154, a transcriber 155, and a fixer 158.

The image forming part 150 may further include a paper feeder (not shown) for feeding the recording medium P. An electrostatic latent image is formed on the photoreceptor 151. The photoreceptor 151 may be referred to as a photosensitive drum, a photosensitive belt, or the like depending on the form thereof.

The charger 152 charges a surface of the photoreceptor 151 to a uniform potential. The charger 152 may be implemented in the form of a corona charger, a charging roller, a charging brush, or the like.

The exposer 153 forms the electrostatic latent image on the surface of the photoreceptor 151 by changing the surface potential of the photoreceptor 151 according to image information to be printed. As an example, the exposer 153 may form the electrostatic latent image by irradiating light modulated according to the image information to be printed onto the photoreceptor 151. The exposer 153 of this type may be referred to as a photo scanner or the like, and an LED may be used as a light source.

The developer 154 accommodates a developing solution therein, and supplies the developing solution to the electrostatic latent image to develop the electrostatic latent image into a visible image. The developer 154 includes a developing roller 157 that supplies the developing solution to the electrostatic latent image. For example, the developing solution may be supplied from the developing roller 157 to the electrostatic latent image formed on the photoreceptor 151 by a developing electric field formed between the developing roller 157 and the photoreceptor 151.

The visible image formed on the photoreceptor 151 is transferred to the recording medium P by the transcriber 155 or an intermediate transfer belt (not illustrated). The transcriber 155 may transfer the visible image to the recording medium, for example, by an electrostatic transfer method. The visible image is attached to the recording medium P by electrostatic attraction.

The fixer 158 fixes the visible image on the recording medium P by applying heat and/or pressure to the visible image on the recording medium P. The printing job is completed by a series of processes as described above.

The developing solution is used every time the image forming job proceeds, and becomes exhausted when it is used for a predetermined time or more. In this case, a unit for storing the developing solution (for example, the above-described developer 154) itself needs to be newly replaced. Such parts or components that may be replaced during the use of the electronic device are referred to as a consumable unit or replaceable unit. In addition, the consumable unit may be equipped with a memory (or CRUM chip) for proper management of the consumable unit.

Figure 3:
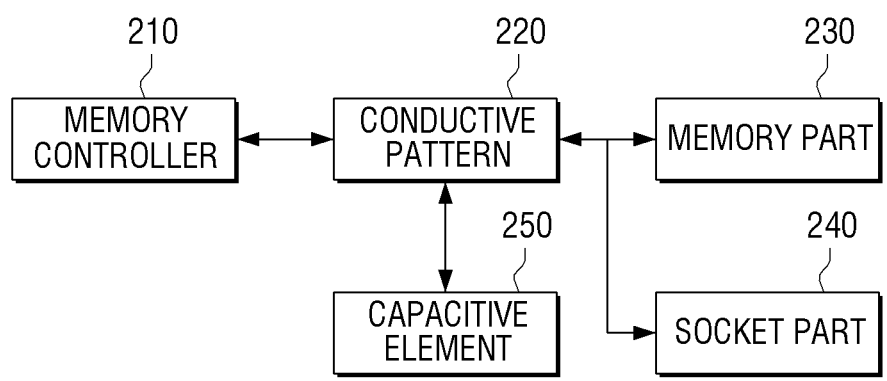
FIG. 3 is a block diagram of an electronic device according to an example.

FIG. 3 is a block diagram of an electronic device according to an example. Specifically, FIG. 3 is a diagram illustrating only a portion related to a memory element among the configurations of the processor of FIG. 1. Therefore, the configuration of FIG. 3 may be applied not only to the processor of FIG. 1, but also to an electronic device having a configuration different from that of FIG. 1.

Referring to FIG. 3, an electronic device 200 includes a memory controller 210, a conductive pattern 220, a memory part 230, a socket part 240, and a capacitive element 250.

The memory controller 210 manages data transmitted to and received from a memory chip. The memory controller 210 may be implemented as an IC separated from the CPU, and may read data from or write to the memory chip according to the request of the CPU. The memory controller 210 may be a SoC integrated with a function of the CPU. In a case in which the memory controller 210 is the SOC integrated with the function of the CPU, the memory controller 210 may also perform the function of the processor 160 described with respect to FIG. 1.

The memory controller 210 controls operations of a plurality of first memory chips of the memory part 230 (or a base memory). Specifically, the memory controller 210 may be disposed on a circuit board 205 (See FIG. 4), and may generate a variety of signals and a control signal for reading data stored in the plurality of first memory chips or for writing data to the plurality of first memory chips to transmit or receive the signals and the control signal through the conductive pattern 220 disposed on the circuit board. Here, the variety of signals may be a clock signal CLK, ODT, CKE, DQ, DM, DQS, and the like, and the control signal may be an nRAS signal, an nCAS signal, an nWE signal, a bank address group signal, an address group signal, or the like.

Figure 5:
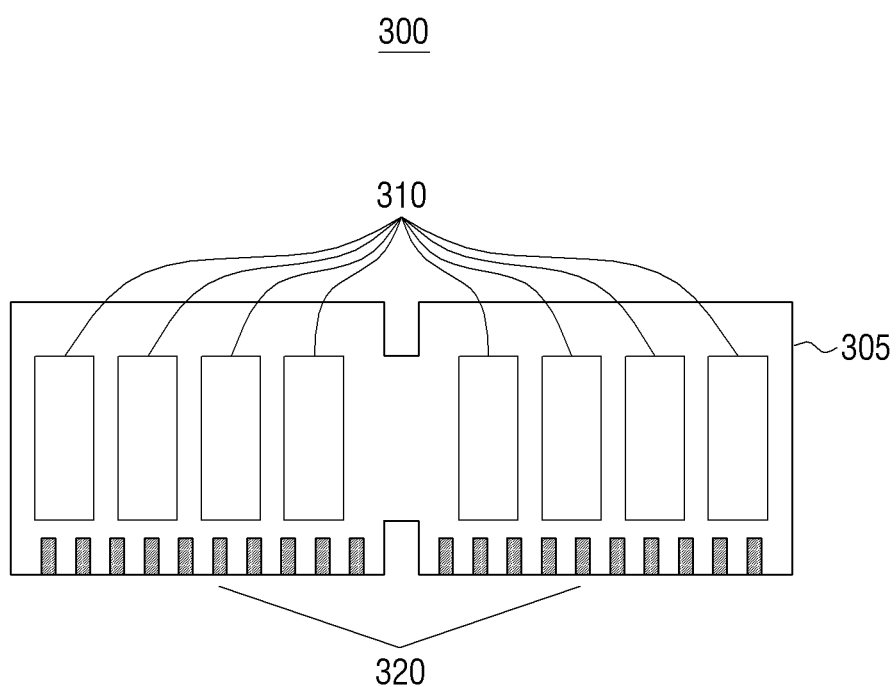
FIG. 5 is a diagram illustrating a circuit board of a memory module according to an example.

In addition, when a memory module 300 (or an extensible memory) in FIG. 5 is connected to the socket part 240, the memory controller 210 may control operations of the plurality of first memory chips and a plurality of second memory chips in the memory module 300.

In this case, the memory controller 210 may read SPD information of the memory module 300 connected to the socket part 240 to check operation speed information (specifically, an operating frequency), and may control the operations of the plurality of first memory chips and the plurality of second memory chips based on the obtained operating frequency. For example, in a case in which the operating frequency of the connected memory module is different from the operating frequency of the plurality of first memory chips in the memory part 230, the memory controller 210 may control the operations of the plurality of first memory chips and the plurality of second memory chips based on a relatively slow operating frequency. For example, when the operating frequency of the memory part 230 mounted on the circuit board is 800 MHz (e.g., DDR3-1600), but the operating frequency of the memory module 300 connected to the socket part 240 is 660 MHz (e.g., DDR3-1320), the memory controller 210 may control the operations of the plurality of first memory chips and the plurality of second memory chips at 660 MHz with a lower operating frequency.

In addition, the memory controller 210 may generate the control signal based on the operating frequency of the memory chips and transmit it to a control line. Specifically, the memory controller 210 may generate the control signal at half the operating frequency of the memory chips.

In addition, the memory controller 210 detects whether or not an error has occurred in at least one of the plurality of first memory chips and the plurality of second memory chips. The memory controller 210 may detect whether or not a fail or the like such as a write/read leveling has occurred. Here, the write/read leveling is a function that compensates for a time delay that must occur because DDRCLK and DQS signals are transmitted in a fly-by structure, and is a function that stably maintains a difference in time between the DDRCLK signal and the DQS signal by applying the DQS signal to each memory chip so as to be matched to the DDRCLK signal in accordance with the time when the DDRCLK signal is sequentially applied to a device connected in the fly-by structure.

Figure 8:
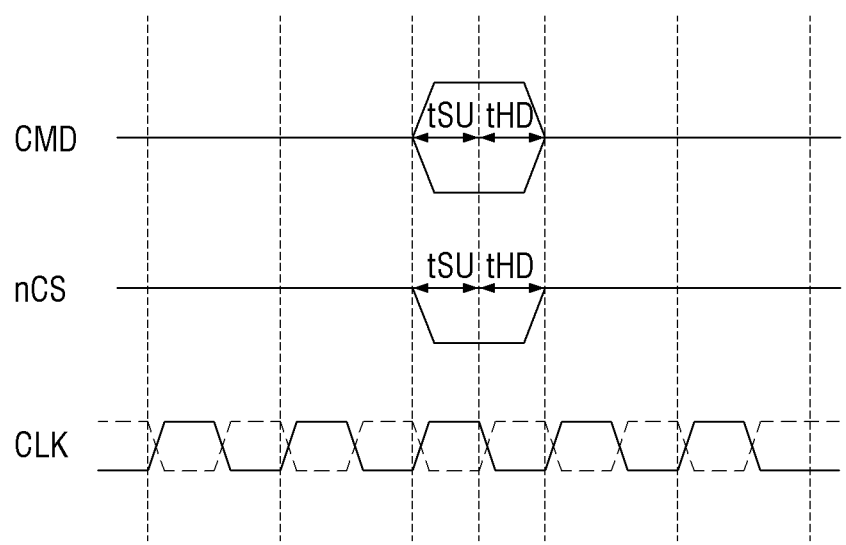
FIGS. 8 and 9 are timing charts illustrating an operation form of a control signal according to an example.
Figure 9:
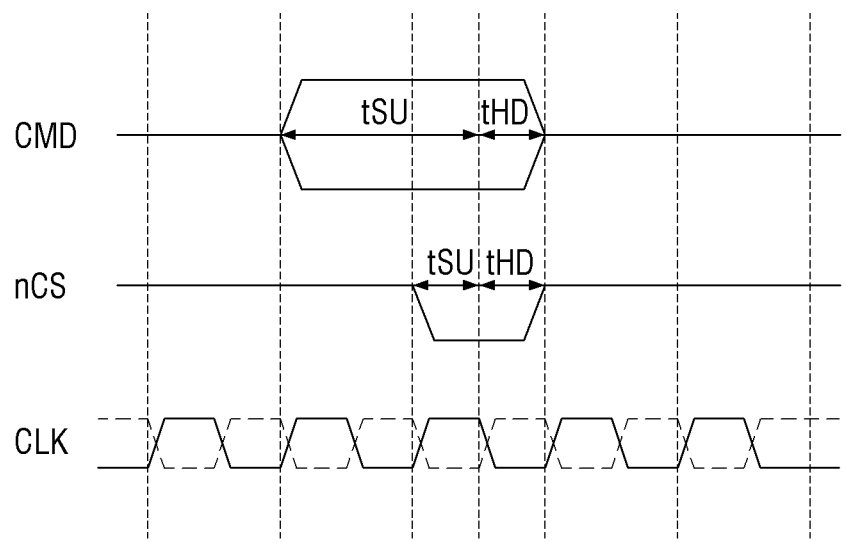

In addition, when the error occurs, the memory controller 210 may generate a control signal having an operating frequency that is slower than an operating frequency of a predetermined control signal and output the control signal to the control line. For example, the memory controller 210 may generate a control signal CMD (e.g., 333.33 MHz) so as to have a half of the operating frequency CLK (e.g., 666.67 MHz) of the memory chip, as illustrated in FIG. 8, in a normal mode. In addition, when the error occurs, the memory controller 210 may generate a control signal (e.g., 166.67 MHz) so as to have a half of the operating frequency of the general control signal, that is, to have a quarter of the operating frequency CLK of the memory chip, as illustrated in FIG. 9.

The conductive pattern 220, which is a conductive pattern that electrically connects the memory controller 210, the memory part 230, and the socket part 240, is disposed on the circuit board 205. The conductive pattern 220 may include a control line that transmits the control signal, and when a plurality of control signals is present, the conductive pattern 220 may include a plurality of control lines.

Here, the control line may connect at least one of a plurality of terminals of the socket part to the plurality of first memory chips sequentially from the memory controller. Therefore, the control line may first provide the control signal to at least one terminal of the socket part 240, and then sequentially provide the control signal to the plurality of first memory chips in a fly-by manner. Here, at least one terminal of the socket part 240 is a terminal corresponding to a terminal of the memory module 300 providing the control signal to the plurality of second memory chips of the memory module 300.

In addition, the capacitive element 250 and a pull-up resistor may be connected to the control line. A detailed form in which the capacitive element and the pull-up resistor are disposed will be described below with reference to FIGS. 10 to 13.

In addition, the conductive pattern 220 may further include a data transmission and reception line for transmitting and receiving a variety of signals between the memory controller 210, the memory part 230 and the socket part 240.

A detailed form in which the control line and the data transmission and reception line of the conductive pattern 220 are disposed will be described below with reference to FIGS. 6 and 7.

The memory part 230 (or the base memory) includes the plurality of first memory chips mounted on the circuit board. Here, the plurality of first memory chips configure one rank. The memory part 230 may include eight or sixteen first memory chips, and may be connected in a 32-bit form or in a 64-bit form. In addition, each of the memory chips may be a memory chip that supports a DDR3-1320 standard, a DDR3-1333 standard, a DDR3/4-1600 standard, a DDR3/4-1866 standard, a DDR3/4-2133 standard, a DDR4-2666 standard, and a DDR4-3200 standard, which operate at 660 MHz or higher. The above-mentioned standards are merely examples, and as long as the memory chip operates at 660 MHz or higher, the disclosure may be applied thereto.

The socket part 240 includes a plurality of terminals that are electrically connected to the memory module 300. Specifically, the socket part 240 may include the plurality of terminals through which a variety of configurations included in the electronic device 100 access the memory module (or a memory device) 300 and supply power to the memory module 300. Here, in a case in which the memory module 300 mounted on the socket part 240 is a DDR3 or DDR4 standard, the number of the plurality of terminals may have the number of pins corresponding to a standard type socket. Alternatively, when a manufacturer directly manufactures and uses the socket, the number of the plurality of terminals may have the number of pins more or less than the number of pins corresponding to the standard type socket. In addition, the plurality of terminals of the socket part 240 may be disposed to correspond to the plurality of terminals of the memory module 300.

The capacitive element 250 (or a shunt capacitor) may improve impedance characteristics of the control line to prevent the control signal transmitted through the control line from invading an eye mask. The capacitive element 250 may be connected to the control line at a predetermined position between at least one terminal of the socket part 240 and the memory controller 210. Here, the predetermined position is a distance corresponding to an odd multiple of the operating frequency of the control signal from at least one terminal of the socket part 240. The position of the capacitive element will be described in detail with reference to FIG. 12.

Meanwhile, when a plurality of control lines is provided on the circuit board 205, a plurality of capacitive elements 250 may also be provided and connected to the plurality of control lines, respectively. In addition, the capacitive element may be implemented as a capacitor having capacitance of 0.1 pF to 18 pF.

As described above, since the electronic device 100 according to the present example operates through the memory part 230 mounted on the circuit board and includes the socket part 240 for expanding memory capacity, the memory capacity of the electronic device 100 may be increased simply by connecting a new memory module 300 to the socket part 240. In addition, since the electronic device 100 does not remove a pre-mounted memory chip to increase the memory capacity, it is possible to minimize the cost due to the increase in the capacity.

In addition, as the capacitive element 250 is disposed between the socket part 240 and the memory controller 210, the electronic device 100 according to the present example may solve a problem of signal quality due to an influence of the socket part 240, thereby enabling stable operation. An effect of the disclosure as described above will be described below with reference to FIGS. 14 to 21.

Figure 4:
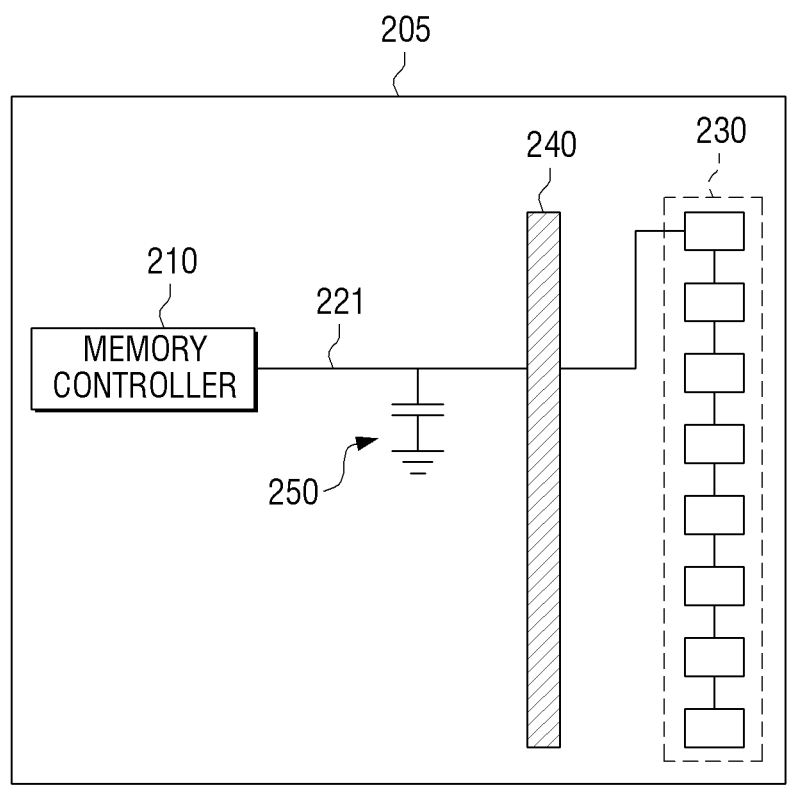
FIG. 4 is a diagram illustrating a circuit board of the electronic device according to an example.

FIG. 4 is a diagram illustrating a circuit board of the electronic device according to an example.

Referring to FIG. 4, the circuit board 205 (or a main board) includes the memory controller 210, the control line 221, the socket part 240, and the memory part 230.

The circuit board 205 is a printed circuit board (PCB) on which the components such as the memory controller 210, the socket part 240, and the memory part 230 are mounted. Here, the circuit board 205 may be a single-sided board, or a double-sided board having a conductive layer on opposite sides thereof. Alternatively, the circuit board 205 may also be a multilayer board including a power layer, a signal layer, and the like in the circuit board 205.

The memory controller 210, the socket part 240, and the memory part 230 are disposed in predetermined regions of the circuit board 205, respectively. Specifically, as described below, since the control line is connected to the memory controller 210, the socket part 240, and the memory part 230 in order, the socket part 240 may be disposed on the circuit board 205 between the memory controller 210 and the memory part 230. Meanwhile, although the memory controller 210, the socket part 240, and the memory part 230 are illustrated as being disposed on one straight line in the illustrated example, the memory controller 210, the socket part 240, and the memory part 230 may also be disposed in the form of '¬'. In addition, the memory controller 210 and the socket part 240 may be disposed in an upper portion of the circuit board, and the memory part 230 may also be disposed in a lower portion thereof.

In addition, the conductive pattern 220 electrically connecting the memory controller 210, the socket part 240, and the memory part 230 to each other is disposed on the circuit board 205. Although only one control line is illustrated in the drawing for easiness of explanation, a plurality of data signal lines may be disposed together with a plurality of control lines at the time of implementation. The conductive pattern 220 may also disposed only on an upper surface of the circuit board 205 and may also be disposed on the upper and lower surfaces of the circuit board 205.

The control line 221 may be connected to at least one terminal of the socket part 240 starting from an output terminal of the memory controller 210, and may be sequentially connected to each of the plurality of first memory chips of the memory part 230. That is, the control line may connect the plurality of memory chips to each other in the form of fly-by topology.

In addition, the capacitive element 250 may be connected to a predetermined position of the control line 221 between the memory controller 210 and the socket part 240. Since the capacitive element 250 is disposed between the memory controller 210 and the socket part 240 as described above, it is possible to efficiently remove reflection noise (e.g., noise caused by the terminals of the socket) of the control signal transmitted through the control line.

In order to efficiently remove the reflection noise, the capacitive element 250 is disposed to be spaced apart from the socket part 240 by a distance corresponding to an odd multiple of the operating frequency of the control signal, which may result in the maximum effect that high frequency noise may be reduced.

FIG. 5 is a diagram illustrating a circuit board of a memory module according to an example.

Referring to FIG. 5, the memory module 300 has a plurality of second memory chips 310 and a terminal part 320 disposed on a circuit board 305.

The plurality of second memory chips 310 may be disposed only on the same surface of the circuit board 305, and may be disposed on both surfaces of the circuit board 305. A memory capacity of the memory module 300 may be variously implemented depending on the capacity and quantity of the memory chips included therein. For example, when the capacity of the memory module is 8 GB, the memory capacity of the memory module 300 may be implemented by disposing eight memory chips of 4 Gb on both surfaces of the circuit board. Alternatively, the memory capacity of the memory module 300 may also be implemented by four memory chips of 8 Gb on a single surface of the circuit board or by four memory chips of 8 Gb in pairs on both surfaces of the circuit board 305.

Each of the plurality of second memory chips 310 may be a memory chip that supports a DDR3-1320 standard, a DDR3-1333 standard, a DDR3/4-1600 standard, a DDR3/4-1866 standard, a DDR3/4-2133 standard, a DDR4-2666 standard, and a DDR4-3200 standard, which operate at 660 MHz or higher. The above-mentioned standards are merely examples, and as long as the memory chip operates at 660 MHz or higher, the disclosure may be applied thereto.

The terminal part 320 interfaces between the memory controller 210 and the plurality of second memory chips 310, and is disposed on one side surface of the circuit board 305. For example, the terminal part 320 has a plurality of terminals and is disposed on a side surface of the circuit board 305 so as to be connected to the socket part 340 of the circuit board 305. Although it is illustrated in the example that the terminal part 320 is disposed only on one surface of the circuit board 305, the terminal part 320 may be disposed on the other surface of the circuit board 305.

Here, in a case in which the memory module 300 is a DDR3 or DDR standard, the number of the plurality of terminals may have the number of pins corresponding to a standard type socket. Alternatively, when a manufacturer directly manufactures and uses the socket, the number of the plurality of terminals may have the number of pins more or less than the number of pins corresponding to the standard type socket. In addition, the plurality of terminals of the terminal part 320 may be disposed to correspond to the plurality of terminals of the socket part 240.

In addition, conductive patterns connecting the plurality of second memory chips 310 and the terminal part 320 is disposed on the circuit board 305. At least one of the conductive patterns includes a terminal receiving a control signal and a control line that sequentially connects the plurality of second memory chips to each other. That is, the control line of the memory module 300 may also connect the plurality of second memory chips to each other in the form of fly-by topology.

Figure 6A:
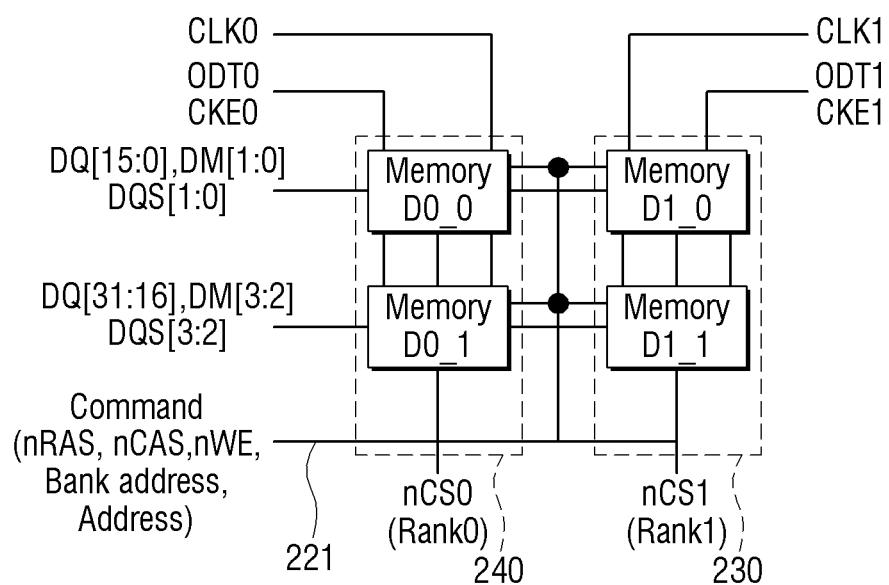
FIGS. 6A and 6B are diagrams illustrating various 32-bit connection forms of a memory chip according to an example.
Figure 6B:
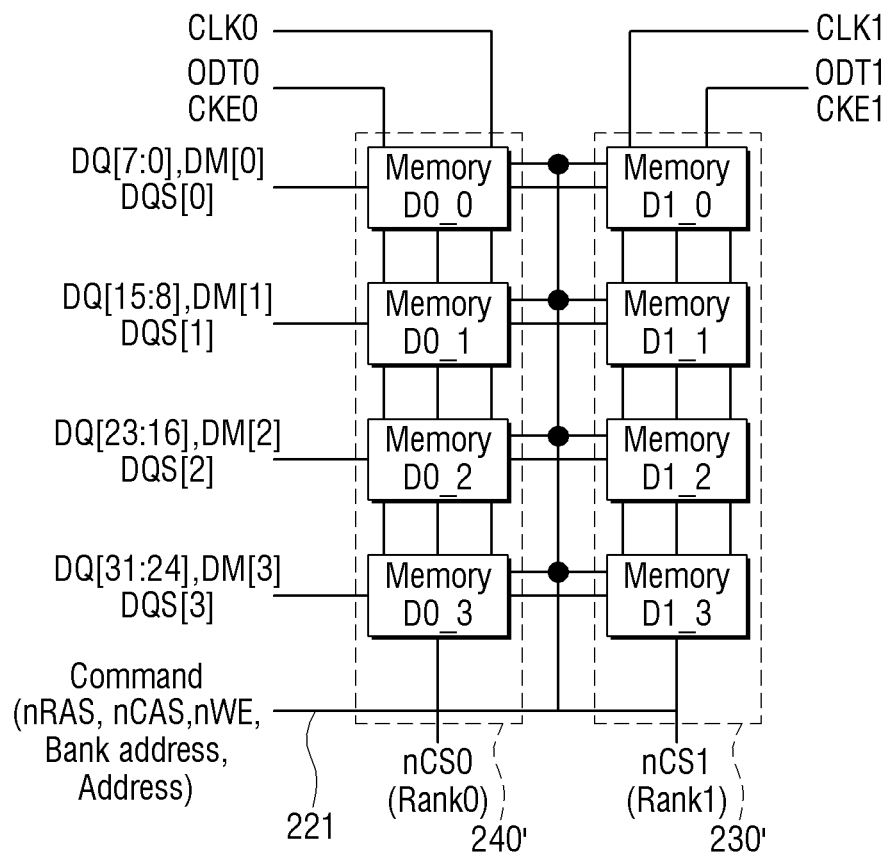

FIGS. 6A and 6B are diagrams illustrating various 32-bit connection forms of a memory chip according to an example. Specifically, FIG. 6A illustrates a 32-bit connection form using four memory chips, and FIG. 6B is an example illustrating a 32-bit connection form using eight memory chips.

Hereinafter, a description will be provided on the assumption that the memory module is connected through the socket part 240.

Referring to FIG. 6A, two second memory chips in the memory module 300 connected through the socket part 240 configure one rank (rank 0), and two first memory chips of the memory part 230 mounted on the circuit board configure one rank (rank 1). As described above, since 16-bit memory chips configure the rank in units of two, the memory chips of FIG. 6A operate a 32-bit memory.

Meanwhile, although it is illustrated in the example that the two first memory chips mounted on the circuit board configure the rank 1, the two first memory chips may also be configured in the rank 0 at the time of implementation.

In addition, a plurality of signal lines and a control line 221 are connected to a plurality of first memory chips and a plurality of second memory chips.

Referring to FIG. 6B, four second memory chips in the memory module 300 connected through a socket part 240' configure one rank (rank 0), and four first memory chips of a memory part 230' mounted on the circuit board configure one rank (rank 1). As described above, since 8-bit memory chips configure the rank in units of four, the memory chips of FIG. 6B operate a 32-bit memory.

Meanwhile, although it is illustrated in the example that the four first memory chips mounted on the circuit board configure the rank 1, the four first memory chips may also be configured in the rank 0 at the time of implementation.

In addition, a plurality of signal line and a control line are connected to a plurality of first memory chips and a plurality of second memory chips.

Figure 7A:
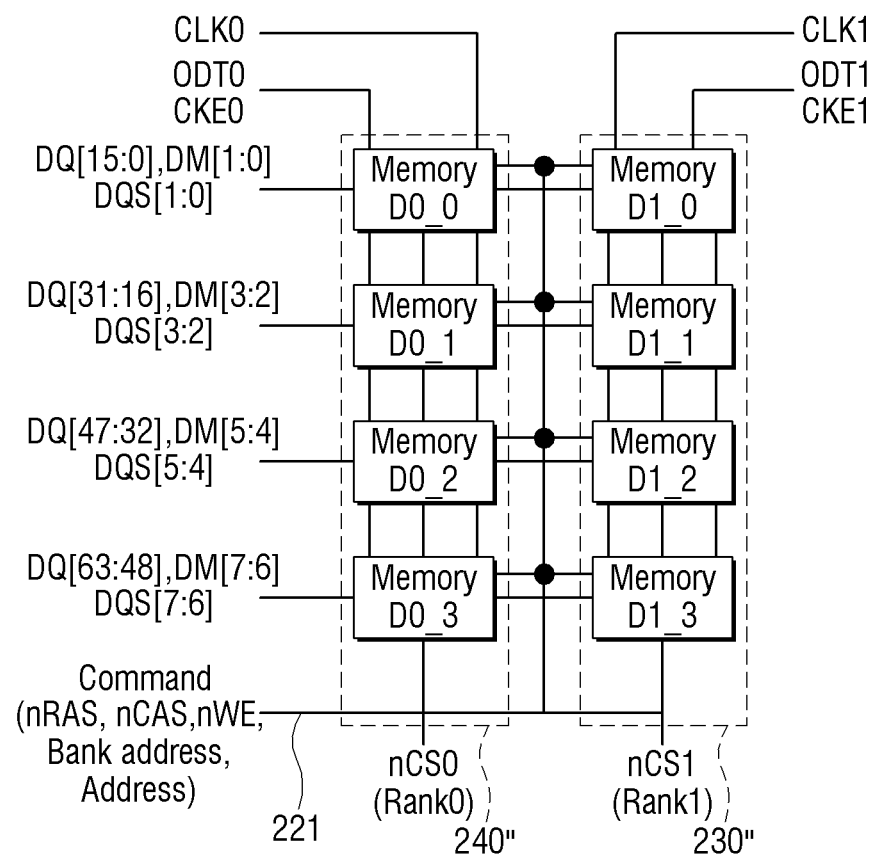
FIGS. 7A and 7D are diagrams illustrating various 64-bit connection forms of the memory chip according to an example.
Figure 7B:
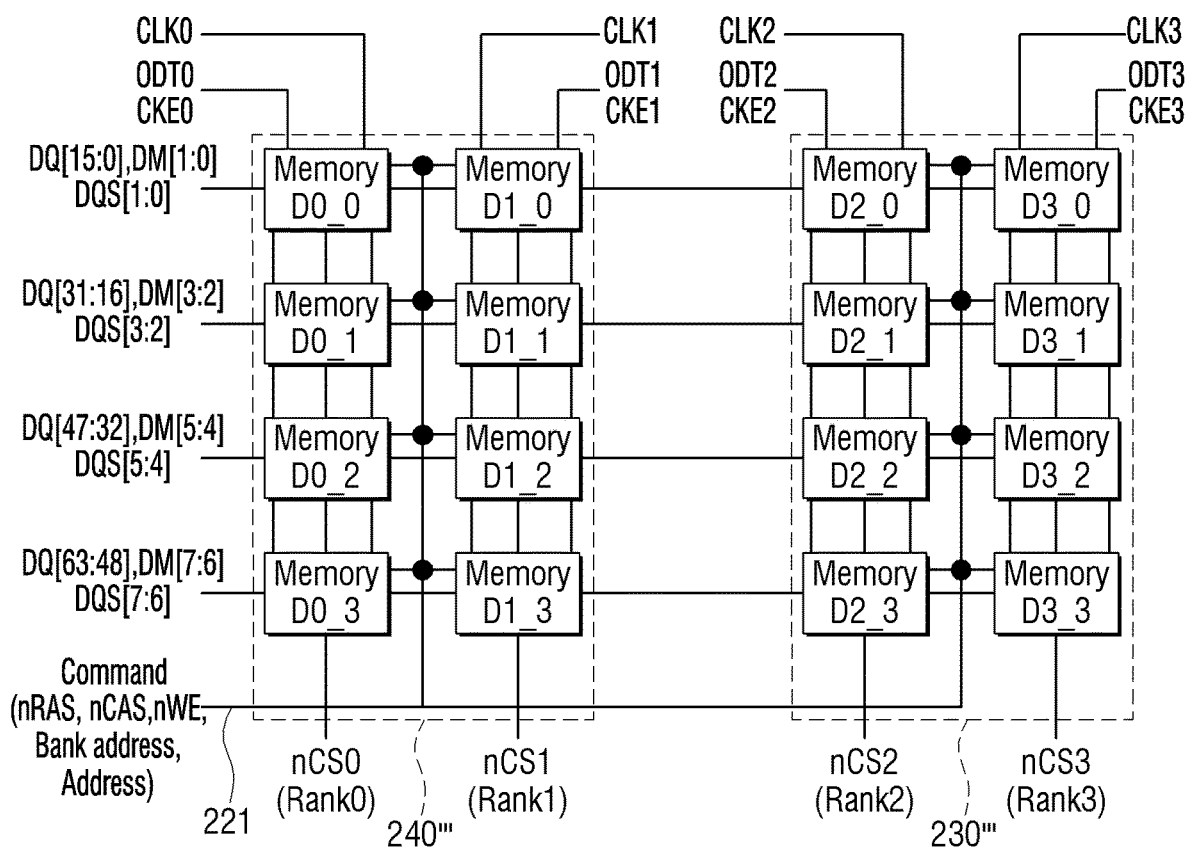
Figure 7C:
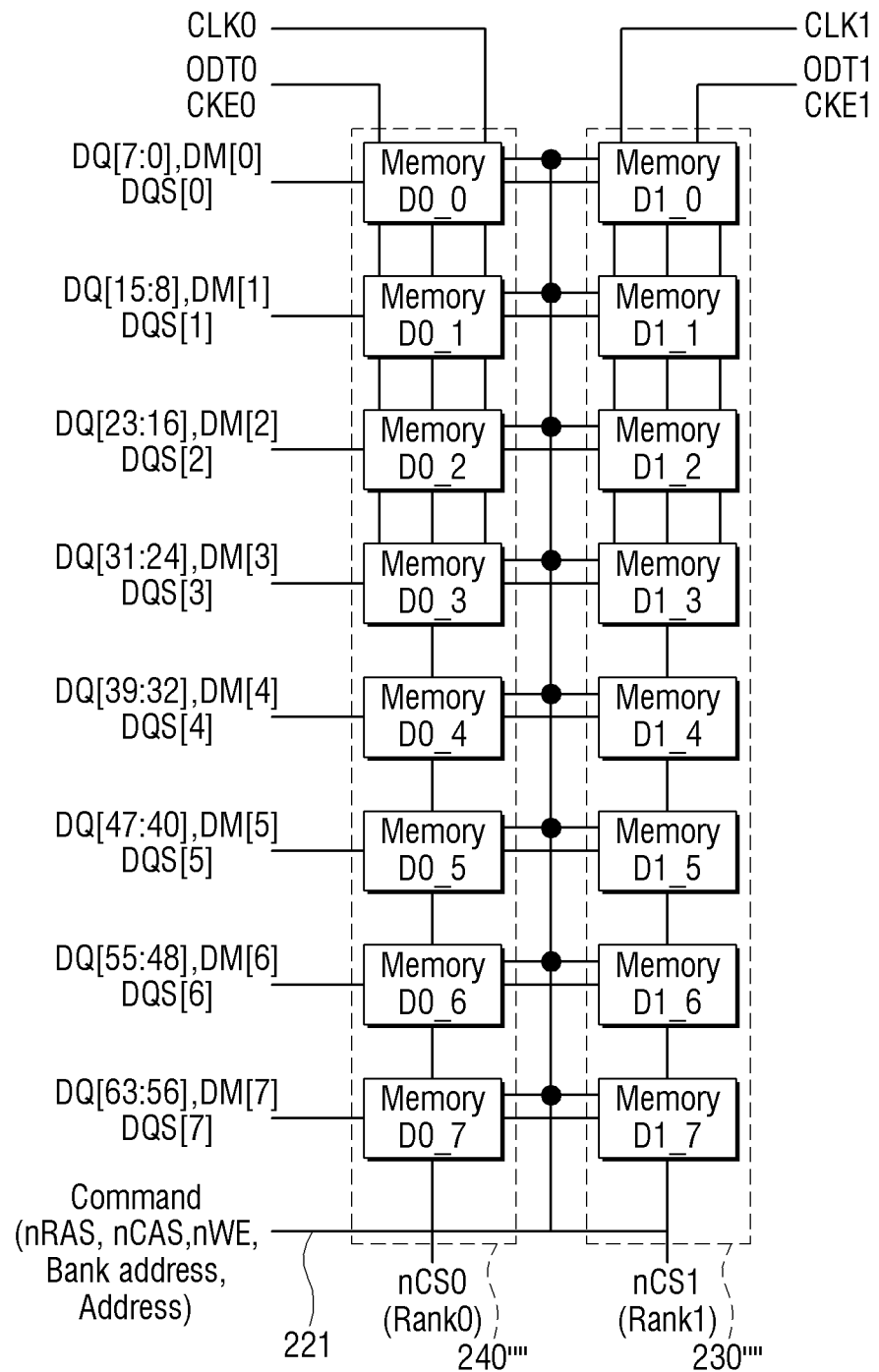
Figure 7D:
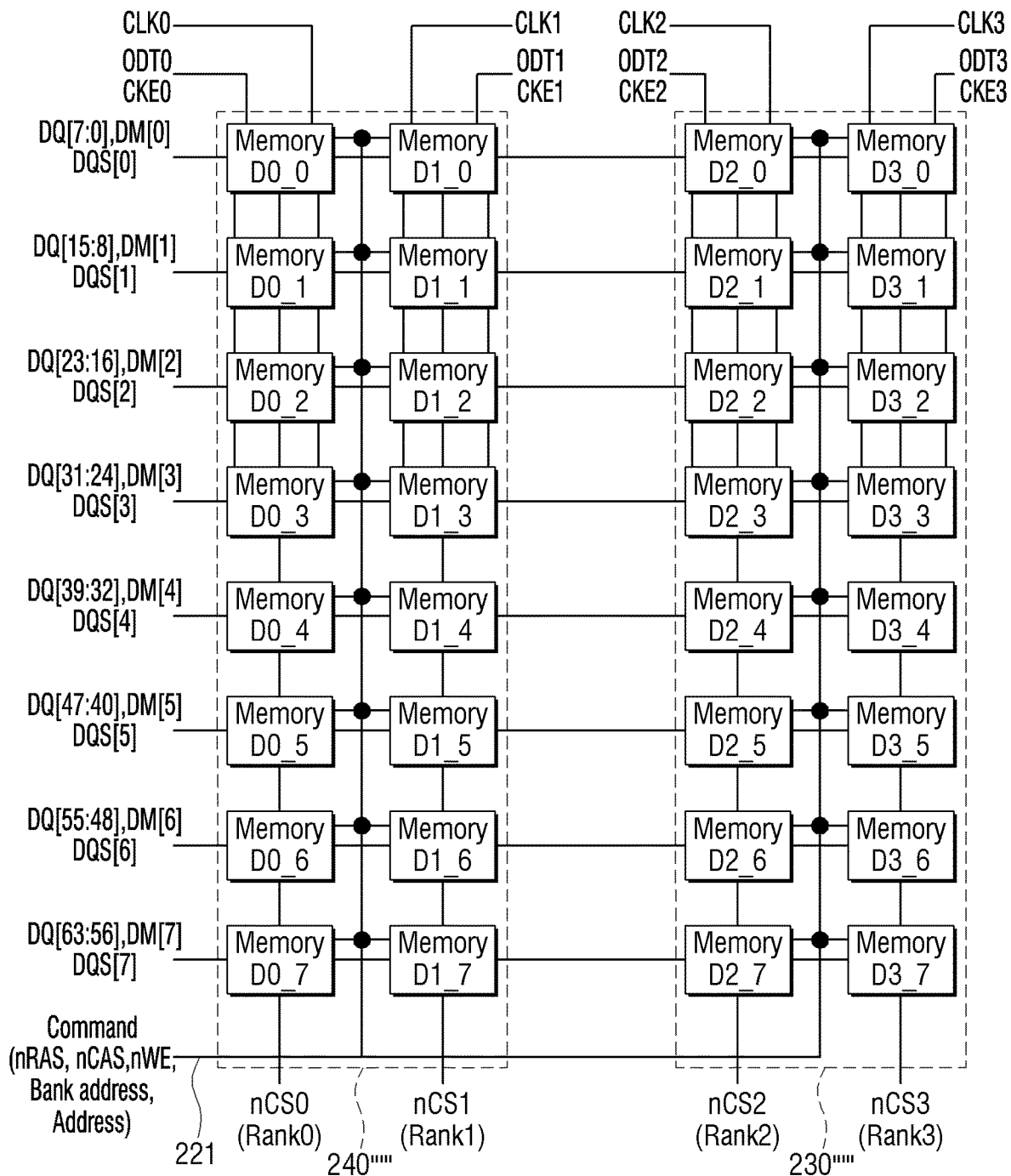

FIGS. 7A and 7D are diagrams illustrating various 64-bit connection forms of the memory chip according to an example. Specifically, FIG. 7A is an example of a 64-bit connection form using eight memory chips, FIG. 7B is an example illustrating a 64-bit connection form using sixteen memory chips, FIG. 7C is an example illustrating a 64-bit connection form using sixteen memory chips, and FIG. 7D is an example illustrating a 64-bit connection form using thirty-two memory chips.

Referring to FIG. 7A, fourth second memory chips in the memory module 300 connected through a socket part 240" configure one rank (rank 0), and four first memory chips of the memory part 230" mounted on the circuit board configure one rank (rank 1). As described above, since 16-bit memory chips configure the rank in units of four, the memory chips of FIG. 7A operate a 64-bit memory.

Meanwhile, although it is illustrated in the example that the four first memory chips mounted on the circuit board configure the rank 1, the four first memory chips may also be configured in the rank 0 at the time of implementation.

In addition, a plurality of signal lines and a control line 221 are connected to a plurality of first memory chips and a plurality of second memory chips.

Referring to FIG. 7B, eight second memory chips in the memory module connected through a socket part 240''' configure two ranks (rank 0, 1), and eight first memory chips of a memory part 230''' mounted on the circuit board configure two ranks (rank 2, 3). As described above, since 16-bit memory chips configure the rank in units of four, the memory chips of FIG. 7B operate a 64-bit memory.

Meanwhile, although it is illustrated in the example that the eight first memory chips mounted on the circuit board configure the ranks 2 and 3, the eight first memory chips may also be configured in the ranks 0 and 1 at the time of implementation.

In addition, a plurality of signal lines and a control line 221 are connected to a plurality of first memory chips and a plurality of second memory chips.

Referring to FIG. 7C, eight second memory chips in the memory module 300 connected through a socket part 240'''' configure one rank (rank 0), and eight first memory chips of a memory part 230'''' mounted on the circuit board configure one rank (rank 1). As described above, since 8-bit memory chips configure the rank in units of eight, the memory chips of FIG. 7C operate a 64-bit memory.

Meanwhile, although it is illustrated in the example that the eight first memory chips mounted on the circuit board configure the rank 1, the eight first memory chips may also be configured in the rank 0 at the time of implementation.

In addition, a plurality of signal lines and a control line 221 are connected to a plurality of first memory chips and a plurality of second memory chips.

Referring to FIG. 7D, sixteen second memory chips in the memory module connected through a socket part 240''''' configure two ranks (rank 0, 1), and sixteen first memory chips of a memory part 230''''' mounted on the circuit board configure two ranks (rank 2, 3). As described above, since 8-bit memory chips configure the rank in units of eight, the memory chips of FIG. 7D operate a 64-bit memory.

Meanwhile, although it is illustrated in the example that the sixteen first memory chips mounted on the circuit board configure the ranks 2 and 3, the sixteen first memory chips may also be configured in the ranks 0 and 1 at the time of implementation.

In addition, a plurality of signal lines and a control line 221 are connected to a plurality of first memory chips and a plurality of second memory chips.

Referring to FIGS. 6 and 7 as described above, it may be seen that a DQ signal, a DM signal, a DQS signal, and the like are connected to the two (or four) memory chips, while the control signal of a nRAS signal, a nCAS signal, a nWE signal, a bank address signal, an address signal, and the like are commonly fed to sixteen (or thirty two) memory chips in total.

As described above, the control line providing the control signal is susceptible to the reflection noise as compared with other signal lines because there are many memory chips connected thereto. It is appreciated that the influence of the reflection noise becomes larger as the driving speed of the memory chip (in particular, the driving speed of the control signal) has recently been increased. Accordingly, when a memory chip operating at an operating frequency of 660 MHz or higher is used, a technique for reducing the reflection noise may be needed.

According to an example of the disclosure, the reflection noise is reduced by connecting the capacitive element to the predetermined position of the control line as described above, thereby improving signal quality of the control signal.

A method for reducing the reflection noise will be described below in detail with reference to FIGS. 10 to 12.

Figure 10:
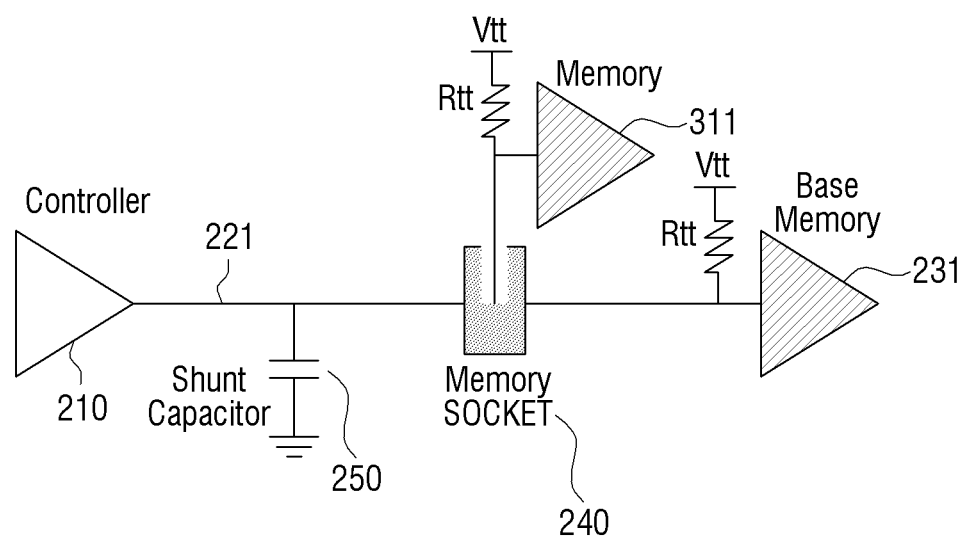
FIG. 10 is a diagram illustrating a connection form of a control line according to a first example.

FIG. 10 is a diagram illustrating a connection form of a control line according to a first example.

Referring to FIG. 10, the control line 221 is sequentially connected to the memory controller 210, at least one terminal of the socket part 240, and a first memory chip. Here, at least one terminal of the socket part 240 is a terminal corresponding to a terminal of the memory module 300 providing the control signal to the plurality of second memory chips of the memory module 300.

In addition, the capacitive element 250 may be connected to a predetermined position of the control line 221 between the memory controller 210 and the socket part 240. Here, the predetermined position is a distance corresponding to an odd multiple of the operating frequency of the control signal from the socket part 240.

In addition, a pull-up resistor may be connected near an input terminal of each of the memory chips 311 and 231.

Figure 11:
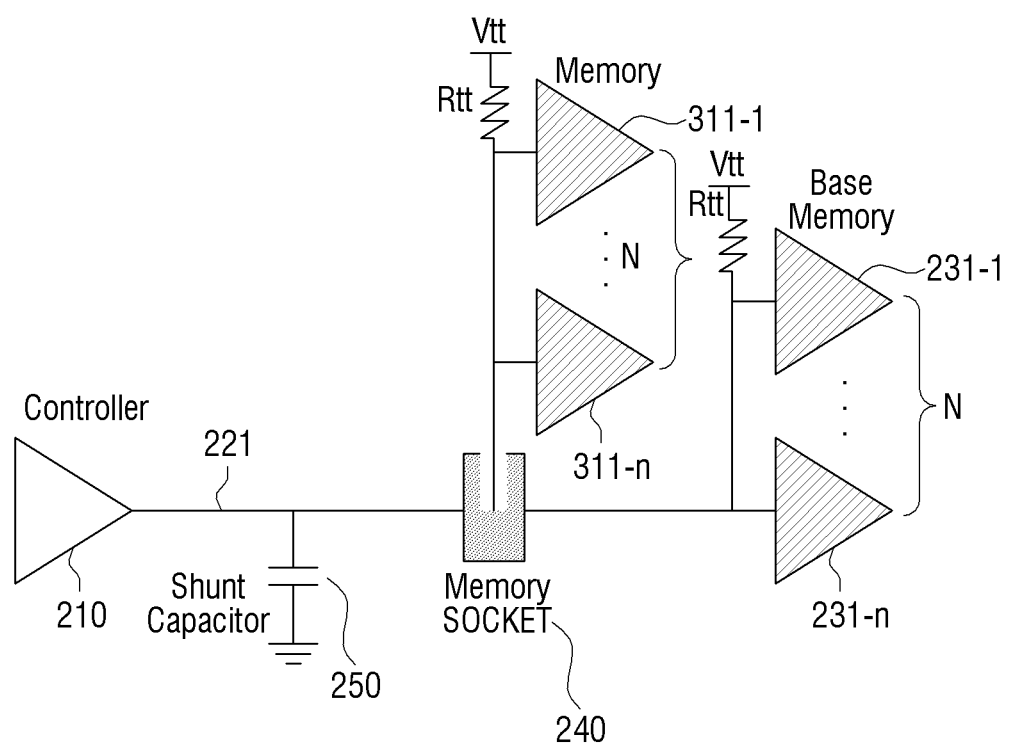
FIG. 11 is a diagram illustrating a connection form of a control line according to a second example.

FIG. 11 is a diagram illustrating a connection form of a control line according to a second example.

Referring to FIG. 11, the control line 221 may be sequentially connected to the memory controller 210, at least one terminal of the socket part 240, and a plurality of first memory chips 231-1 to 231-$n$. Here, at least one terminal of the socket part 240 is a terminal corresponding to a terminal of the memory module 300 which provides the control signal to the plurality of second memory chips of the memory module 300.

In addition, the capacitive element 250 may be connected to a predetermined position of the control line 221 between the memory controller 210 and the socket part 240. Here, the predetermined position is a distance corresponding to an odd multiple of the operating frequency of the socket part 240 and the control signal.

In addition, a pull-up resistor may be connected near an input terminal of each of the memory chips 311-1 to 311-$n$ and 231-1 to 231-$n$.

Figure 12:
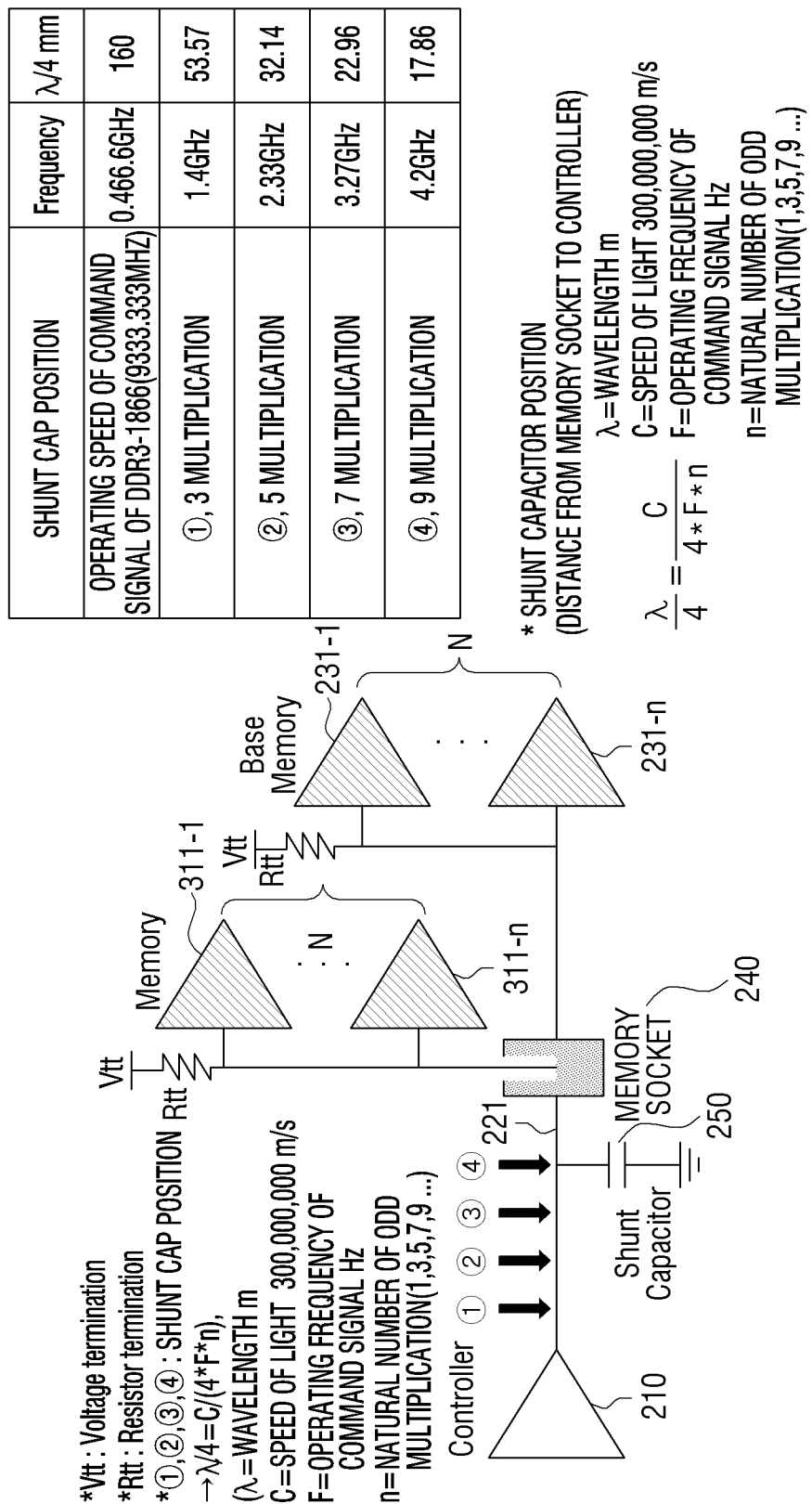
FIG. 12 is a diagram for describing a position at which a capacitive element is disposed according to an example.

FIG. 12 is a diagram for describing a position at which a capacitive element is disposed according to an example.

Referring to FIG. 12, the capacitive element may be connected to the control line between the socket part 240 and the memory controller 210 so as to have a distance satisfying the following Equation 1 from at least one terminal of the socket part 240. Here, at least one terminal of the socket part 240 is a terminal corresponding to a terminal providing the control signal to the plurality of second memory chips in the memory module 300.

$$\text{Distance from Socket} = \frac{\lambda}{4} = \frac{C}{4*F*n} \qquad \text{[Equation 1]}$$

Where $\lambda$ is a length of a cycle of one wave (specifically, a wave corresponding to the operating frequency of the memory chip), C is a speed of light, F is an operating frequency of the control signal, and n is an odd multiple natural number.

For example, when the first memory chip is configured by the memory chip of the DDR3-1866 standard (the operating frequency of 933.333 MHz), the capacitive element may be connected to the control line between the socket part 240 and the memory controller 210 while having a distance difference of 53.57 mm, 32.14 mm, 22.96 mm, 17.86 mm, or the like from the socket part 240. FIG. 13 illustrates distance differences according to Equation 1 described above for each of the various memory standards. It is preferable to connect the capacitive element to the control line while having the distance difference described above at the time of implementation, but even though the capacitive element is connected to a position near (within ±10%) the distance difference, it may be possible to obtain an effect of reducing radio noise.

Hereinafter, a change of the control signal when the capacitive element is positioned at a fourth position (i.e., a distance corresponding to the $9^{th}$ multiplication of the operating frequency) in FIG. 12 will be described based on various waveform diagrams.

Figure 14:
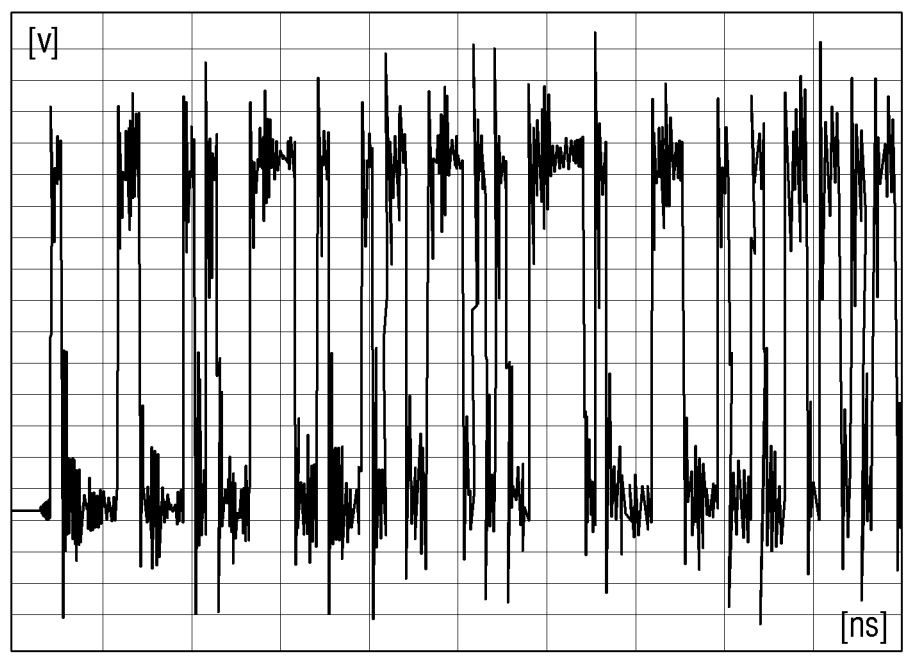
FIG. 14 is a waveform diagram of a control signal of a case in which the capacitive element is not disposed.
Figure 15:
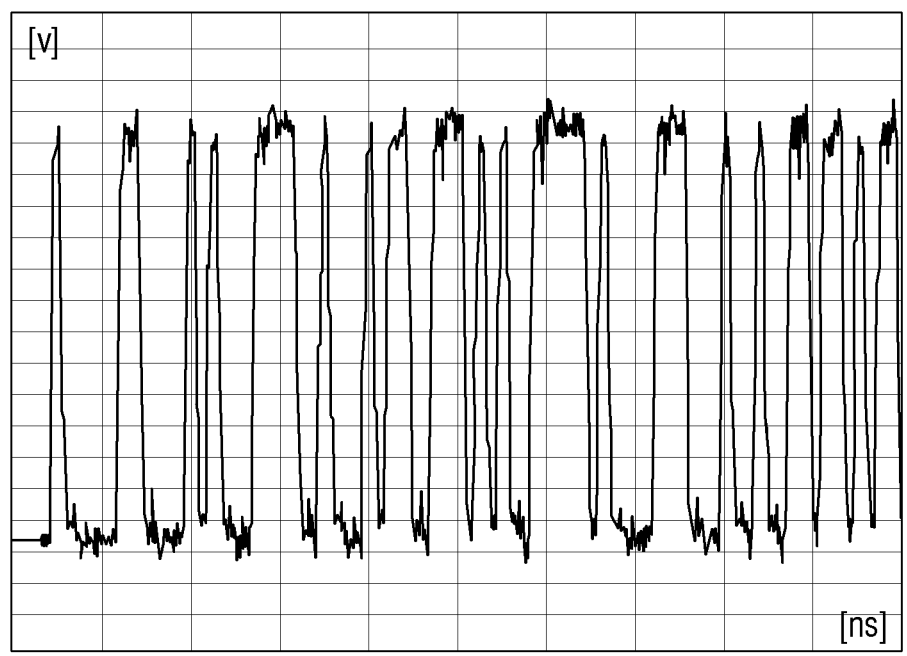
FIG. 15 is a waveform diagram of a control signal of a case in which the capacitive element is disposed.

FIG. 14 is a waveform diagram of a control signal of a case in which the capacitive element is not disposed, and FIG. 15 is a waveform diagram of a control signal of a case in which the capacitive element is disposed.

Referring to FIG. 14, it may be seen that the control signal contains a lot of high frequency noise in a control signal waveform. The high frequency noise is caused by the reflection noise of the socket part 240, and the reflection noise may interfere a normal operation of the electronic device.

Referring to FIG. 15, it may be seen that as the capacitive element is connected to the predetermined position (the distance corresponding to the $9^{th}$ multiplication of the operating frequency) of the control line, the high frequency noise is significantly removed from the control signal.

Figure 16:
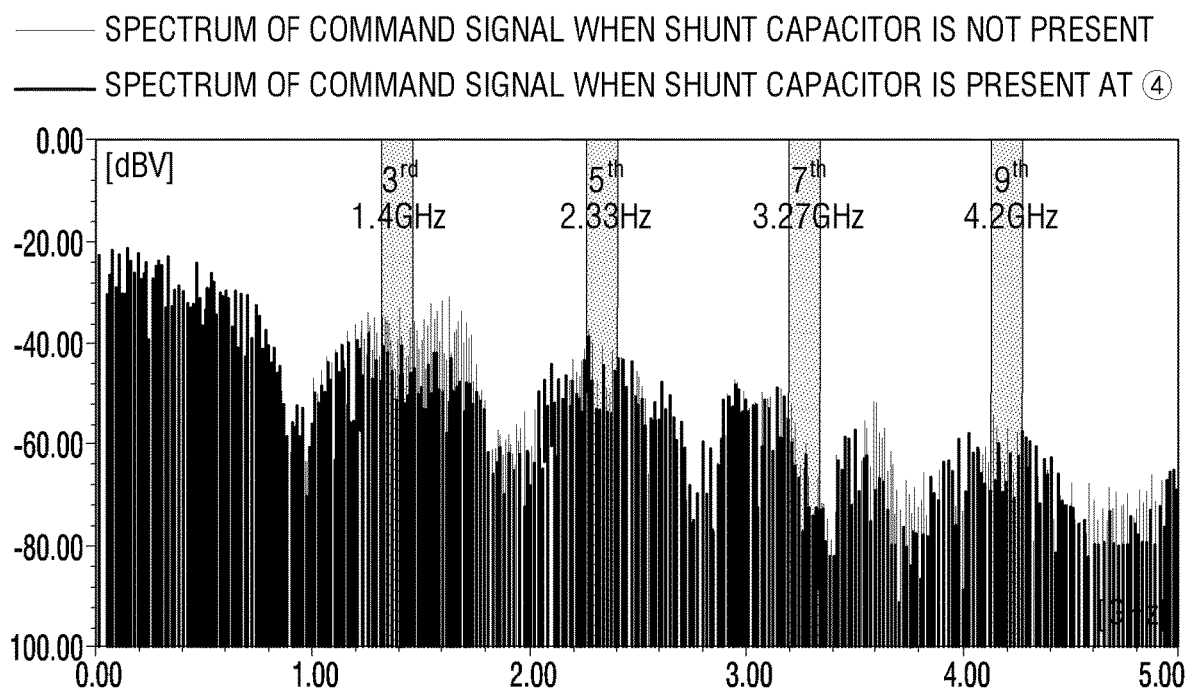
FIG. 16 is a spectrum of a control signal depending on whether or not the capacitive element is present.

FIG. 16 is a spectrum of a control signal depending on whether or not the capacitive element is present. Specifically, FIG. 16 is a spectrum obtained by converting a time domain waveform of the control signal depending on whether or not the capacitive element is present into a frequency domain by Fast Fourier transform.

Referring to FIG. 16, it may be seen that a case in which the capacitive element is not connected in a high frequency region of 1 GHz or more has higher values than in a case in which the capacitive element is connected.

In particular, it may be seen that the high frequency component is observed at 1.4 GHz, 2.33 GHz, 3.27 Hhz, and 4.2 GHz, which are positioned near λ/4 of the odd multiple of the operating frequency of the control signal from the socket part 240 to the memory controller 210.

Figure 17:
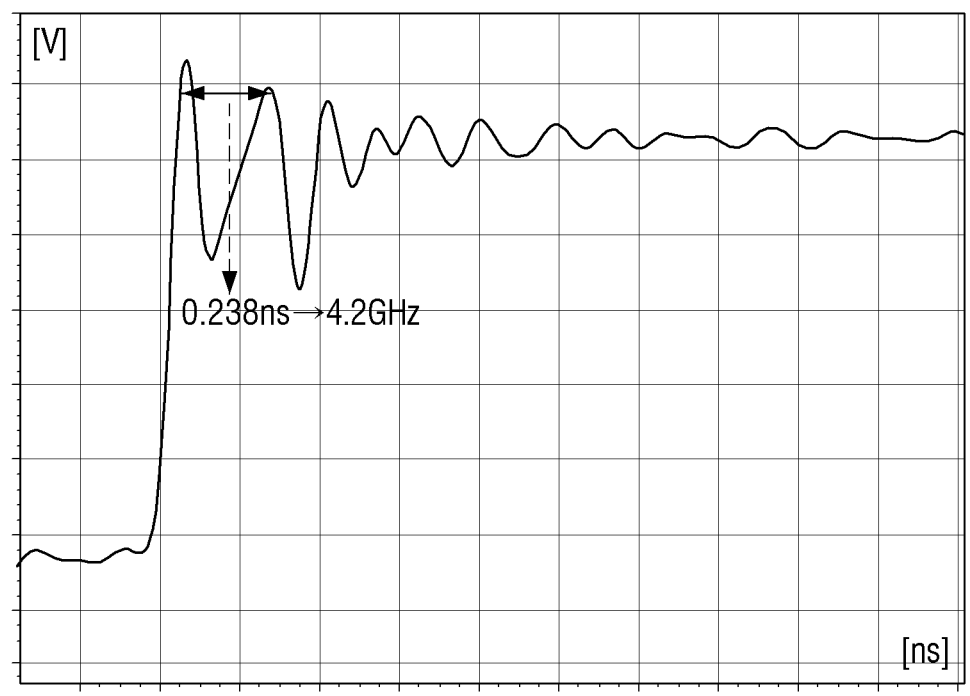
FIG. 17 is an enlarged waveform diagram of a control signal of a case in which the capacitive element is not disposed.

FIG. 17 is an enlarged waveform diagram of a control signal of a case in which the capacitive element is not disposed.

Referring to FIG. 17, it may be seen that when the capacitive element is not disposed, the reflection noise is included in the control signal, and the cycle of the high frequency noise 4.2 GHz (the $9^{th}$ multiplication of the operating frequency), which is 0.127 ns.

Figure 19:
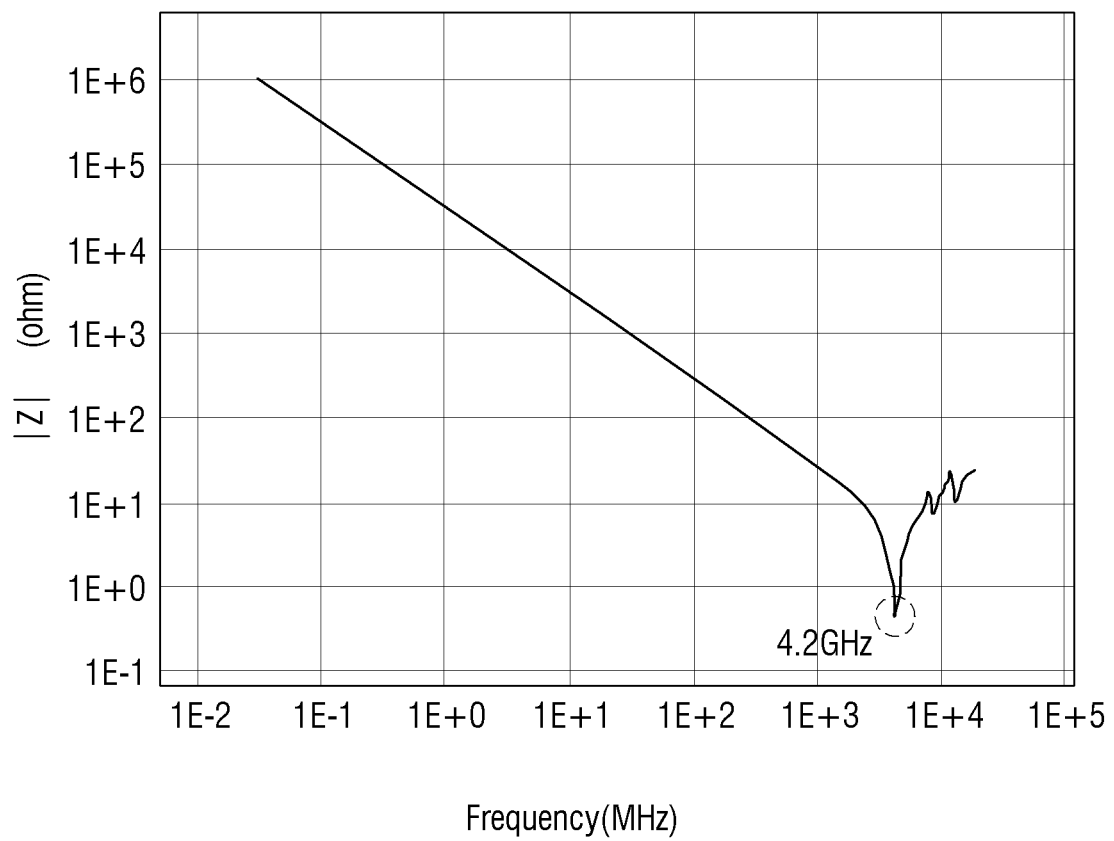
FIG. 19 is an impedance cover of a case in which a capacitive element of 5 pF is disposed.

In order to remove such a noise, a capacitor having specific capacitance (capacitance within the range of 0.1 pF to 18 pF, in the illustrated example, 5 pF) may be disposed to have a distance corresponding to an odd multiplication of the operating frequency from the socket part. Specifically, as illustrated in FIG. 19, since the corresponding high frequency component is de-coupled (a phenomenon that DC does not pass through, and AC, which is a noise component, escapes to the ground depending on the characteristics of the capacitor) at a position at which impedance by an inductance capacitance (LC) of the capacitor is minimized (i.e., near λ/4 of the operating frequency of the odd multiplication of the control signal), the effect of reducing the reflection noise is maximized. In consideration of the above, the capacitance of the capacitive element may have a value corresponding to the odd multiplication of the operating frequency of the control signal. However, a capacitor having capacitance in the range of 0.1 pf to 18 pF may be used in consideration of a size of the capacitor and a difference of each manufacture vendor.

Figure 18:
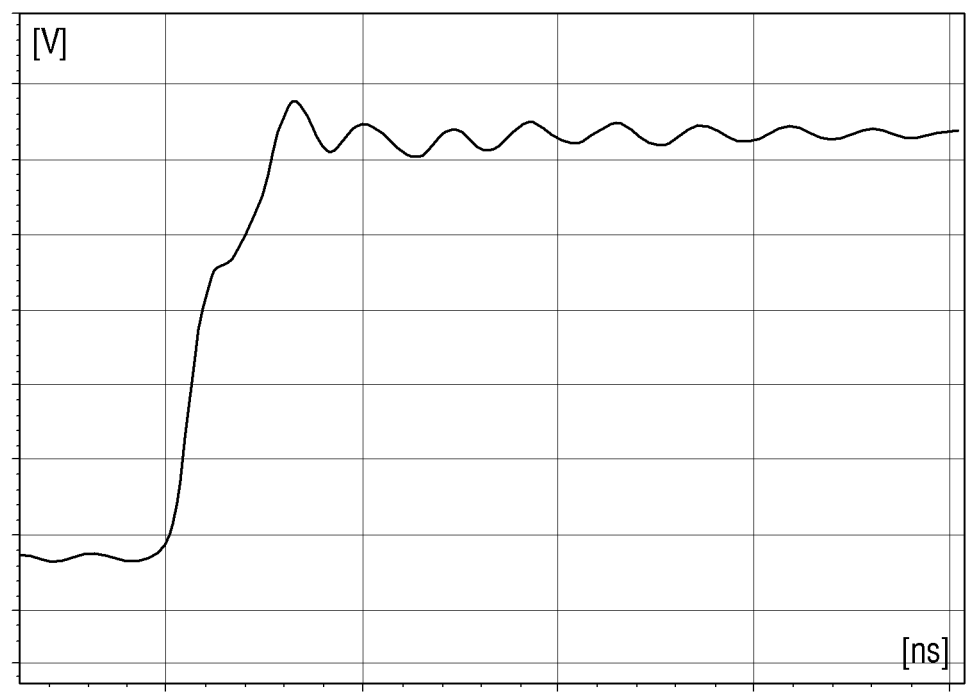
FIG. 18 is an enlarged waveform diagram of a control signal of a case in which the capacitive element is disposed.

The above-mentioned capacitor is connected to a connection line at a predetermined position, and as illustrated in FIG. 18, the waveform of the control signal in which the high frequency component is reduced may be obtained.

Figure 20:
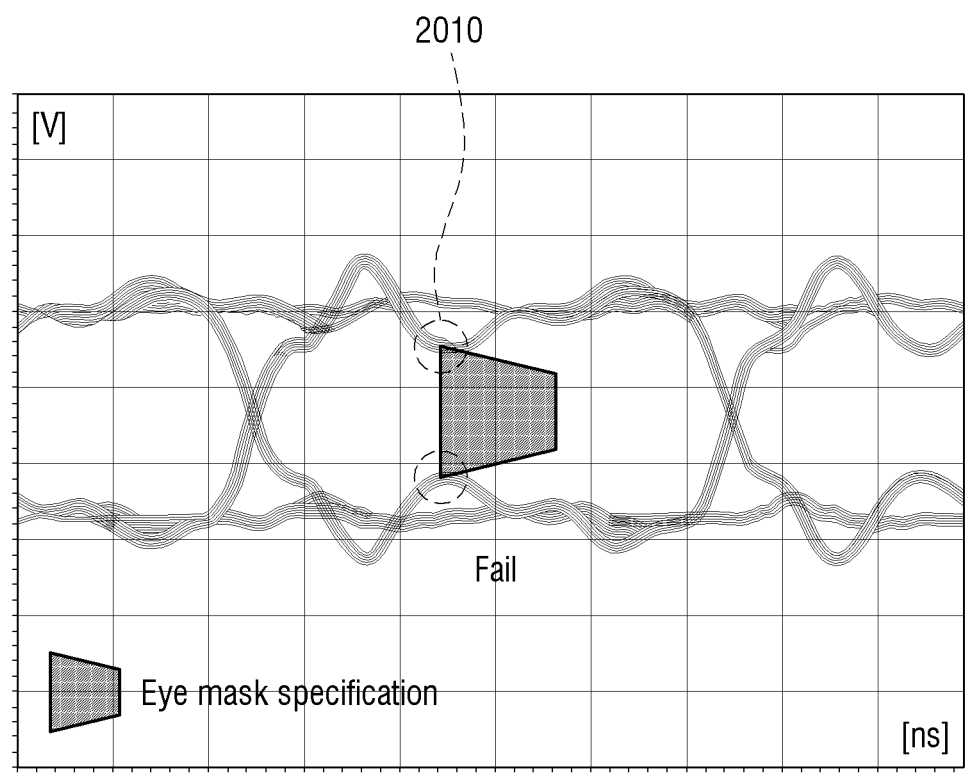
FIG. 20 is an eye diagram of a case in which the capacitive element is not disposed.
Figure 21:
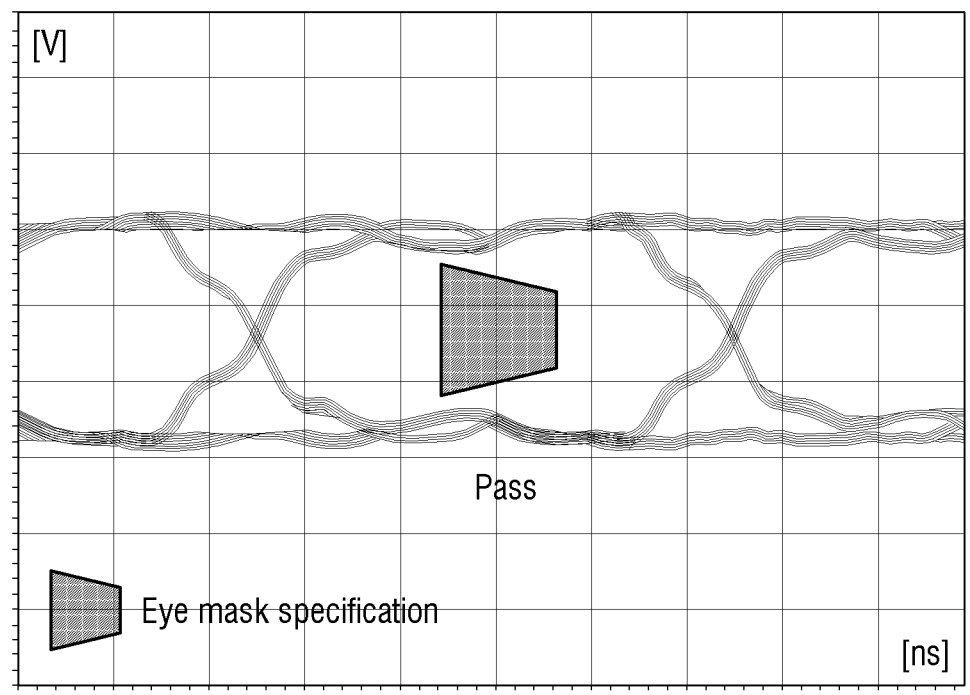
FIG. 21 is an eye diagram of a case in which the capacitive element is disposed.

FIG. 20 is an eye diagram of a case in which the capacitive element is not disposed, and FIG. 21 is an eye diagram of a case in which the capacitive element is disposed.

Referring to FIG. 20, the high frequency component is directly exposed to the control signal and touches an eye mask specification, so that a fail may occur in a system operation.

On the contrary, referring to FIG. 21, it is illustrated that the eye mask specification is passed because the high frequency component is reduced by the capacitive element and does not touch the eye mask specification.

Figure 22:
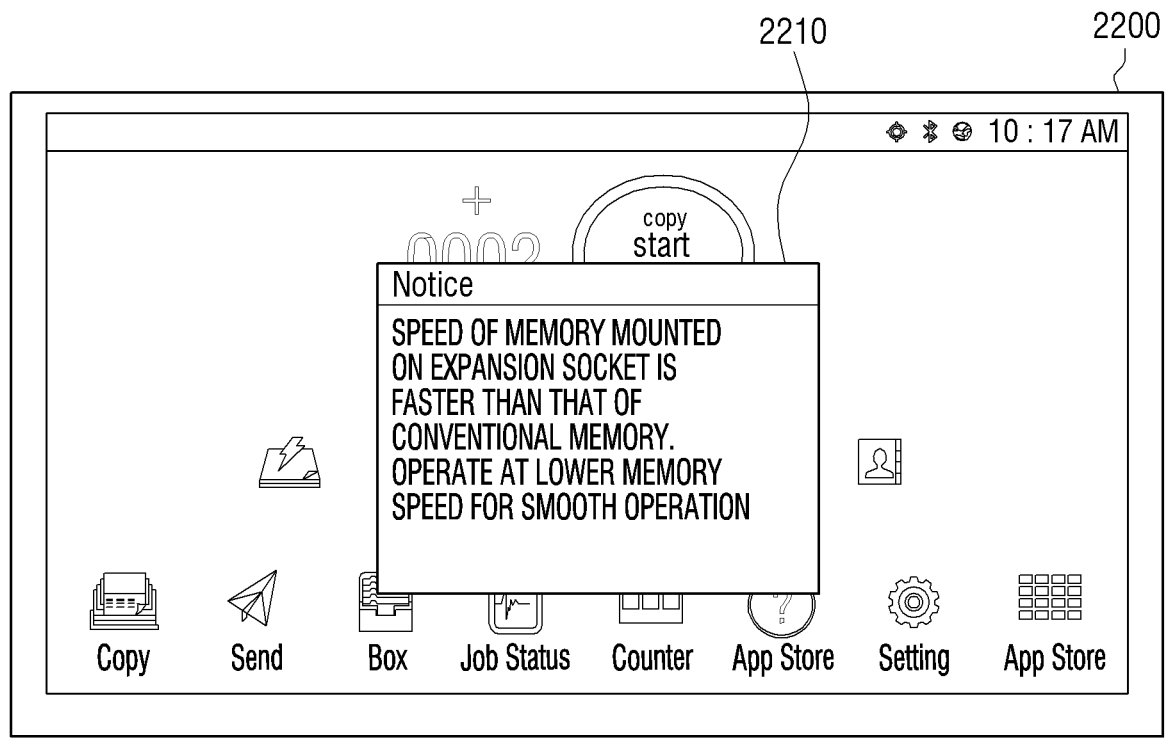
FIGS. 22 and 23 are diagrams illustrating various examples of a user interface window displayable on a display of FIG. 1.
Figure 23:
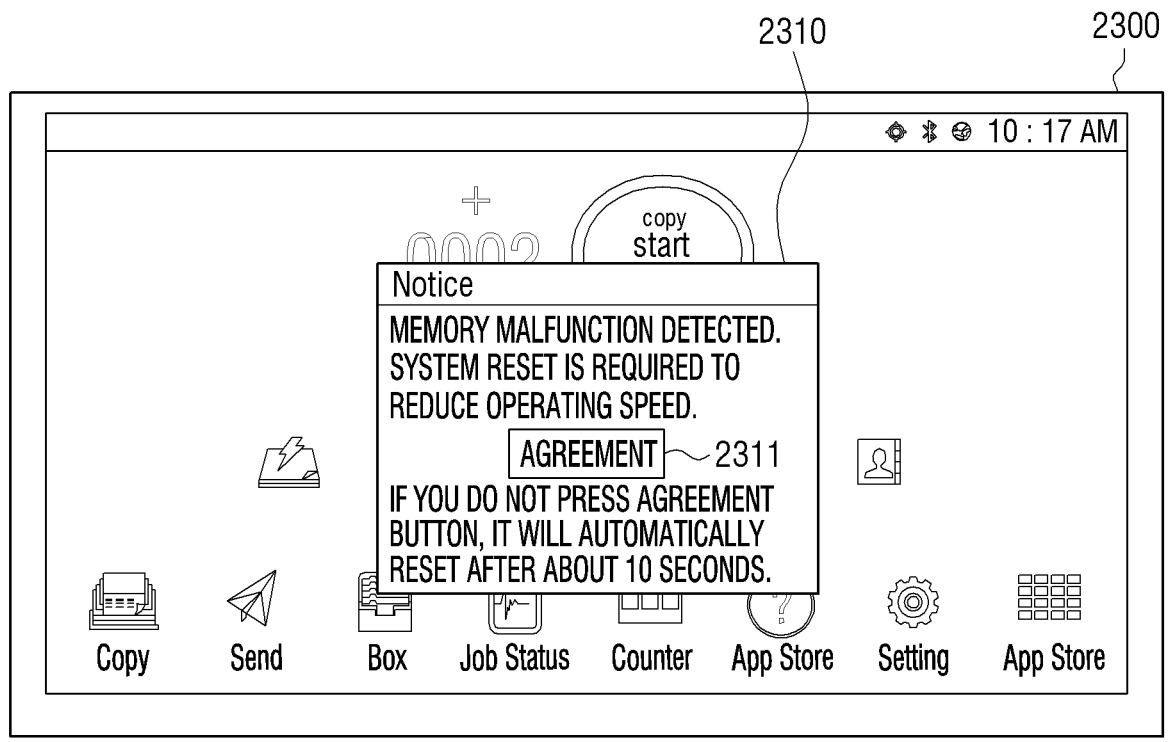

FIGS. 22 and 23 are diagrams illustrating various examples of a user interface window displayable on the display of FIG. 1.

Referring to FIG. 22, a user interface window 2200 includes a notification message 2210 displayed when the operating frequencies of the first memory chip and the second memory chip are different from each other.

For example, in a case in which the operating frequency of the newly mounted memory module 300 is faster than the operating frequency of the memory part, the notification message 2210 displays that an operation is performed at the operating frequency of the memory part. If the operating frequency of the newly mounted memory module 300 is slower than the operating frequency of the memory part, the notification message 2210 may display that the operation is performed at the operating frequency of the newly mounted memory module 300. In this case, the notification message 2210 may display a message together that suggests replacing and mount a newly processed memory module with a memory module having an operating frequency that is equal to or faster than the operating frequency of the memory part.

Referring to FIG. 23, a user interface window 2300 includes a notification message 2310 indicating that an error has occurred in a memory accessing process.

Specifically, when the error occurs in the memory accessing process, an operation of reducing the operating frequency of the control signal may be performed, and a conversion of the control signal may be performed through a user's agreement as illustrated FIG. 23, or may be automatically performed. If the user selects an agreement region 2311, the memory controller may operate by generating the control signal at an operating frequency slower than an operating frequency of a default control signal through a reset process.

Figure 24:
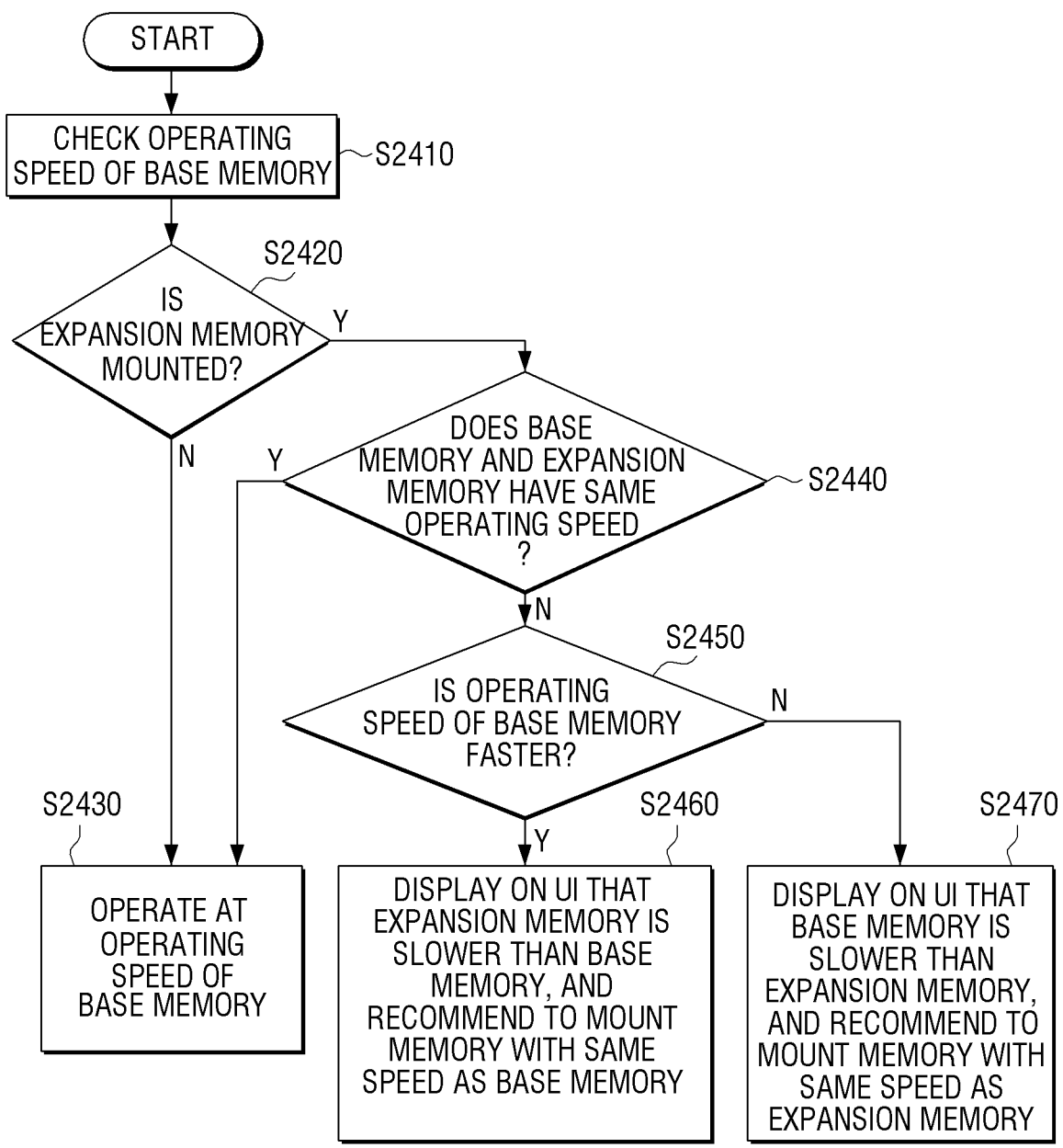
FIG. 24 is a flowchart for describing a control method of a plurality of memories according to an example of the disclosure.

FIG. 24 is a flowchart for describing a control method of a plurality of memories according to an example of the disclosure.

Referring to FIG. 24, the memory controller checks an operating frequency of the memory part mounted on the circuit board (S2410). Specifically, the memory controller may check the operating frequency of the memory part by checking SPD information of the memory part 230.

Thereafter, it is checked whether the memory module 300 is connected through the socket part (S2420).

If the memory module 300 is not connected (S2420-N), a plurality of first memory chips in the memory part may be controlled based on the operating frequency of the memory part (S2430).

On the contrary, if the memory module 300 is connected (S2420-Y), the memory controller checks an operating frequency of the memory module 300, and determines whether the operating frequency of the memory module 300 and the operating frequency of the memory part are equal to each other (S2440).

As a result of the determination, if the operating frequencies of the memory module and the memory part are equal to each other (S2440-Y), the memory controller may control the plurality of first memory chips in the memory part and the second memory chips in the memory module (S2430).

If the operating frequencies of the memory module and the memory part are different from each other (S2440-N), the memory controller determines whether the operating frequency of the memory part 230 is slower (S2450), and if the operating frequency of the memory part 230 is slower (S2450-Y), the memory controller may control the plurality of first memory chips in the memory part 230 and the second memory chips in the memory module 300 based on the operating frequency of the memory part 230 (S2460). In addition, the memory controller may display a notification message that the operating frequency of the installed memory module is different from the operating frequency of the memory part.

If the operating frequency of the memory part 230 is faster (S2450-N), the memory controller may control the plurality of first memory chips in the memory part 230 and the second memory chips in the memory module 300 based on the operating frequency of the memory module 300 (S2470). In addition, the memory controller may display a notification message that the operating frequency of the installed memory module is different from the operating frequency of the memory part.

The control method of the plurality of memories as illustrated in FIG. 24 may be executed on the memory controller of FIG. 3. In addition, the control method of the plurality of memories as described above may be implemented by at least one execution program for executing the operation as described above, and the execution program may be stored in a computer readable recording medium.

Therefore, the respective blocks according to the disclosure may be implemented as computer recordable codes on the computer readable recording medium. The computer readable recording medium may be a device in which data that may be read by a computer system may be stored.

Although examples of the disclosure have been described hereinabove, the disclosure is not limited thereto, but may be variously modified and altered by those skilled in the art to which the disclosure pertains without departing from the spirit and scope of the disclosure claimed in the claims. These modifications and alterations are to fall within the scope of the disclosure.

The invention claimed is:

1. An electronic device comprising:
   a circuit board;
   a memory part including a plurality of first memory chips mounted on the circuit board;
   a socket part including a plurality of terminals to electrically connect to a memory module including a plurality of second memory chips;
   a memory controller to control an operation of the plurality of first memory chips, and to control operations of the plurality of first memory chips and the plurality of second memory chips when the memory module is connected to the socket part;
   a conductive pattern including a control line that connects at least one of a plurality of terminals of the socket part electrically connectable to the memory module with the plurality of first memory chips, sequentially from the memory controller; and
   a capacitive element connected to the control line at a predetermined position between at least one terminal of the socket part and the memory controller,
      wherein the capacitive element is connected to the control line between at least one terminal of the socket part and the memory controller at a distance corresponding to an odd multiply of an operating frequency of a control signal which is transmitted and received through the control line from at least one terminal of the socket part.

2. The electronic device as claimed in claim 1, wherein the capacitive element is connected to the control line at a distance corresponding to $9^{th}$ multiplication of the operating frequency of the control signal from at least one terminal of the socket part.

3. The electronic device as claimed in claim 1, wherein the capacitive element is connected to the control line between at least one terminal of the socket part and the memory controller so as to have a distance satisfying an Equation:

$$\text{Distance from Socket} = \frac{C}{4*F*n}$$

from at least one terminal of the socket part, and
wherein C is a speed of light, F is the operating frequency of the control signal, and n is a natural number of an odd multiply.

4. The electronic device as claimed in claim 3, wherein the capacitive element is connected to the control line between at least one terminal of the socket part and the memory controller within ±10% of the distance satisfying the Equation.

5. The electronic device as claimed in claim 1, wherein the capacitive element has a capacitance of 0.1 pF to 18 pF.

6. The electronic device as claimed in claim 1, wherein the control line transmits a control signal for controlling the plurality of first memory chips, or the plurality of first memory chips and the plurality of second memory chips.

7. The electronic device as claimed in claim 6, wherein the control signal includes at least one signal of a nRAS signal, a nCAS signal, a nWE signal, a bank address group signal, and an address group signal.

8. The electronic device as claimed in claim 6, wherein the control signal is sequentially provided to the plurality of memory chips, respectively.

9. The electronic device as claimed in claim 6, wherein when an error occurs in at least one of the plurality of first memory chips or the plurality of second memory chips, the memory controller varies an operating frequency of a predetermined control signal to a slower operating frequency and outputs the slower operating frequency to the control line.

10. The electronic device as claimed in claim 1, wherein the conductive pattern includes a plurality of control lines,
the number of the capacitive elements is plural, and
the plurality of capacitive elements is connected to the plurality of control lines, respectively.

11. The electronic device as claimed in claim 1, further comprising a pull-up resistor connected to the control line between at least one terminal of the socket part and the memory part.

12. The electronic device as claimed in claim 1, wherein when the memory module is connected to the socket part, the memory controller acquires an operating frequency information of the connected memory module, and controls the operations of the plurality of first memory chips and the plurality of second memory chips based on information on the acquired operating frequency.

13. The electronic device as claimed in claim 12, wherein when the operating frequency of the connected memory module is different from the operating frequency of the memory part, the memory controller controls the operations of the plurality of first memory chips and the plurality of second memory chips based on a slower operating frequency.

14. The electronic device as claimed in claim 12, further comprising a display to display notification information when the operating frequency of the connected memory module is different from the operating frequency of the memory part.

* * * * *